United States Patent [19]
Robertson et al.

[11] Patent Number: 6,124,813
[45] Date of Patent: Sep. 26, 2000

[54] SELF-LINEARIZING MULTI-BIT DACS

[75] Inventors: David Robertson, Boxford; Anthony Del Muro, Bradford; Steve Harston, N. Andover; Todd L. Brooks, Boston, all of Mass.

[73] Assignee: Analog Devices, Inc., Norwood, Mass.

[21] Appl. No.: 08/870,981

[22] Filed: Jun. 6, 1997

[51] Int. Cl.[7] .................................................. H03M 3/00
[52] U.S. Cl. ............................................ 341/143; 341/144
[58] Field of Search ................................... 341/143, 118, 341/120, 141, 144, 150, 153, 154

[56] References Cited

U.S. PATENT DOCUMENTS

| | | |
|---|---|---|
| 5,138,317 | 8/1992 | Story. |
| 5,221,926 | 6/1993 | Jackson. |
| 5,404,142 | 4/1995 | Adams et al. ........................ 341/144 |

OTHER PUBLICATIONS

"A High Resolution Multibit Sigma–Delta Modulator with Individual Level Averaging," by Feng Chen and Bosco H. Leung, IEEE Journal of Solid–State Circuits, vol. 30, No. 4, Apr. 1995.

"A Noise Shaping Coder Topology for 15+ Bit Converters," by L. Richard Carley, IEEE Journal of Solid–State Circuits, vol. 24, No. 2, Apr. 1989.

"Spectral Shaping of Circuit Errors in Digital–to–Analog Converters," by Ian Galton, IEEE Trans. on Circuits and Systems II: Analog and Digital Signal Processing, Sep. 11, 1996.

"Dynamic Element Matching Techniques with Arbitrary Noise Shaping Function," by R. K. Henderson, Conf. Publ., vol. I, Proceedings of the 1996 IEEE Int'l Symposium on Circuits & Systems, May, 1996.

"An Analysis of Dynamic Element Matching Techniques in Sigma–Delta Modulation," By R. K. Henderspn, Conf. Publ., vol. I, Proceedings of the 1996 IEEE Int'l Symposium on Circuits & Systems, May, 1996.

"Noise–Shaping D/A Converters for $\Delta\Sigma$ Modulation," by Ian Galton, Conference Publ., vol. I, Proceedings of the 1996 IEEE Int'l Symposium on Circuits & Systems, May, 1996.

"Linearity Enhancement of Multibit $\Delta\Sigma$ A/D and D/A Converters Using Data Weighted Averaging," by Rex T. Baird and Terri S. Fiez, IEEE Transactions on Circuits and Systems–II: Analog and Digital Signal Processing, vol. 42, No. 12, Dec. 1995.

"Improved $\Delta\Sigma$ DAC Linearity Using Data Weighted Averaging," by Rex T. Baird and Terri S. Fiez, Conf. Publ., vol. I, Proceedings of the 1995 IEEE Int'l Symposium on Circuits & Systems, May, 1995.

"Multibit $\Sigma\Delta$ A/D Converter Incorporating A Novel Class of Dynamic Element Matching Techniques," by Bosco H. Leung and Sehat Sutaria, IEEE Transactions on Circuits and Systems–II: Analog and Digital Signal Processing, vol. 39, No. 1, Jan. 1992.

*Primary Examiner*—Brian Young
*Attorney, Agent, or Firm*—Wolf, Greenfield & Sacks, P.C.

[57] ABSTRACT

Improved data scramblers and swapper cells and improved digital to analog converters are provided. The improved swapper cells permit data to be propagated through the cell immediately upon receipt. The determination of whether to swap data or pass it directly through is based on a history of data values propagated through the cell, but is independent of the values of the particular inputs being swapped. The data scrambler is structured to permit the possible data inputs on swapper cells in the scrambler to be restricted. A minimum delay data scrambler for use in a fast digital to analog converter is disclosed using these components.

31 Claims, 17 Drawing Sheets

SELF-LINEARIZING MULTI-BIT DACS

FIELD OF THE INVENTION

The present invention relates generally to apparatus and methods useful for digital-to-analog converters (DACs) and, more particularly, to data scramblers and swapper cells for self-linearizing multi-bit DACs.

DISCUSSION OF THE RELATED ART

One of the problems with single bit noise-shaping analog-to-digital converters (ADCs) and DACs is removing the large amount of noise produced by the quantizer. One approach to solving this problem is to use a filter at the output of the converter, with a narrow sharply defined pass-band that passes a narrow frequency band which is a small fraction of the converter clock frequency, as illustrated in FIG. 1A and FIG. 1B. Such filters remove quantization noise by attenuating noise energy in all but a very small band of frequencies. This has the draw-back, however, of reducing the signal bandwidth. Furthermore, such filters are relatively expensive in silicon area, and often exhibit non-ideal behavior such as increased noise and distortion.

Another approach to solving this problem is to use a multi-bit Sigma-Delta modulator, such as in FIGS. 2A and 2B. By using multiple levels and arranging the loop such that the idle-channel limit-cycle noise only spans a few quantization levels, it is possible to reduce the noise significantly compared to the 1-bit case. For example, a loop employing a 5-bit quantizer should allow for reduction of noise by roughly a factor of 32:1.

Such an approach is taken, for example, in the U.S. patent application entitled High-Speed Sigma-Delta ADCs, attorney file number A0312/7265, with Todd L. Brooks and David Robertson as named inventors, filed on even date herewith, which application is commonly owned and is hereby incorporated by reference in its entirety, and the U.S. patent application entitled Multi-Bit Feedback DAC for High-Speed ADCs, attorney file number A0312/7275, with Todd L. Brooks and David Robertson as named inventors, also filed on even date herewith, which application is also commonly owned and is hereby incorporated by reference in its entirety. In this context, as well as in others, the DAC (or DAC portion of a feed-back loop in an ADC) should have a fast propagation time.

In DACs designed for this application (and others), the digital to analog conversion may be performed based on a thermometer code and using a segmented DAC, as shown in FIG. 3. A thermometer code is a code where all of the bits are equally weighted. For example, a 5-bit binary code converted to a thermometer code would require 31 equally-weighted bits (the "all bits off" state does not require an output bit). If the input number was "15," then the thermometer code would have the bottom 15 bits set to a "1" and the top 16 bits set to "0." (An inverted form, where the bottom bits are set to 0 and the top bits are set to 1 may also be referred to as a thermometer code.) A thermometer code translation of a three-bit binary code would be:

| Binary | Thermometer |
| --- | --- |
| 000 | 0000000 |
| 001 | 0000001 |
| 010 | 0000011 |

-continued

| Binary | Thermometer |
| --- | --- |
| 011 | 0000111 |
| 100 | 0001111 |
| 101 | 0011111 |
| 111 | 1111111 |

Thus, in a thermometer code, it is only the number of "on" bits during a clock period that is important (indeed, the order of the bits can be unimportant).

In FIG. 3, therefore, the number of "on" bits of the thermometer code will determine the number of elements used to convert the thermometer code signal to an analog signal. The elements in the segmented DAC may compose, as one example, an array of capacitors. In this case, the thermometer code input will determine the number of capacitors in the capacitor array being charged at any point in time and, therefore, the magnitude of the analog signal generated by the circuit of FIG. 3.

This approach, however, can cause linearity errors in the analog output. For example, small differences in the precise operational parameters of the elements can cause defects in linearity of conversion from digital to analog signals. (This problem does not arise in the single-bit case, because perfect linearity is guaranteed by virtue of the fact that only a single element is used to convert the signal to analog—eliminating the risk of element mismatch.)

One approach to improving linearity is to attempt to reduce mismatch among elements. This increases the cost of manufacture. In addition, there are limits to manufacturing precision for the applicable elements. Accordingly, this approach is of limited usefulness.

Proposals have been made to use "scrambling" techniques to minimize the linearity problem with multi-bit noise-shapers. These approaches randomly shuffle the order of bits over time. Random shuffling can take linearity errors caused by element mismatch and spread that error across the spectrum—like white noise. Thus, scrambling works by dynamically assigning a bit at the scrambler output to one of the input bits, and changing this assignment on a dynamic basis (normally every clock cycle). It will be evident that these input bit-to-output bit assignments must be mutually exclusive. That is, each input bit may be connected to one and only one output bit at one time.

To restate the problem and solution, if a thermometer-decoder output is fed to a DAC consisting of $2^N$ nominally equally-weighted branches that sum into a summing junction, as in FIG. 3, there will always be some error due to analog matching constraints that cause the weights to be slightly in error. This error would result in harmonic distortion, as every particular thermometer-decoded bit is active only during a particular range of input codes to the noise-shaper. With scrambling, there is no longer any correlation between a particular bit coming out of the scrambler and a particular range of input values to the noise-shaper. This causes the error introduced by bit-weight errors in the DAC to be de-correlated from the signal, and hence the effect of a bit-weight error is to cause increased broadband white noise instead of distortion.

Examples of data scramblers for DACs may be found in an article by L. Richard Carley titled "A Noise-Shaping Coder Topology for 15+Bit Converters" IEEE J Solid-State Circuits, Vol. SC-24, pp. 267–273, April 1989, and an article by Bosco H. Leung et al titled "Multibit Sigma-Delta A/D Converter Incorporating A Novel Class of Dynamic Element Matching Techniques," IEEE Transactions on Circuits and Systems-II: Analog and Digital Signal Processing, Vol. 39, No. 1, January 1992.

Random scrambling would choose a random configuration of the scrambler on each clock cycle and could be accomplished in hardware by having a $2^N$ input multiplexer for every output line, where N is the number of binary bits at the input to the thermometer decoder. In this way, every output could independently select an input source, as long as the input source was not already used. However, since this technique requires $2^N$ switches per output line, it is not practical when N is large.

The Carley article, referred to above, proposes a scrambler that is based on a Fast-Fourier-Transform-like "Butterfly" network of switches. This algorithm is carried out by the switch arrangement shown in FIG. 4, illustrated for use with an 8-bit thermometer code input. The switches in each column work in pairs. For example, the first column in FIG. 4 contains two switches (S0 and S4) that are controlled by logic signal "1A." These two switches use opposite polarities of the control signal 1A as indicated by the logic inversion bubble on one of the two switches.

This Butterfly topology does not allow all possible configurations of input to output mappings—only a limited subset. However, every input line can connect to every output line, and the number of switches need only be $Klog_2K$ (where $K=2^N$ and N=number of binary bits at the input to a thermometer decoder) instead of $K^2$ as before.

Since switch "S0" and switch "S4" are both connected to the same two inputs (input I0 and input I4) of FIG. 4, it will be seen that these two switches operate as a "swapper," as illustrated in block format in FIG. 5. This block will either pass its two inputs directly through to the outputs, when the control signal (Norm/Swap) is low, or "swap" them when the control signal goes high so as to connect the inputs to the outputs reversely. Accordingly, the Butterfly scrambling algorithm can be redrawn with all groups of switches that receive the same two inputs shown as "swapper" cells, as shown in FIG. 6. The two switches may be referred to as a "swapper" unit or cell, whether or not the physical devices implementing the switches are located in close physical proximity.

According to the Carley article, each swapper cell would receive a random logic signal (high or low) on each clock cycle. It may be noted that in FIG. 6, the order of the switches in each column has been altered to provide that the interconnection between stages is the same for each stage. Such modification of the flow graph also has been made for FFT structures, as described by A. V. Oppenheim et al, in "Digital Signal Processing," Prentice-Hall, 1975, pg. 309.

The increase in white noise floor power resulting from random scrambling may be acceptable for low-performance designs, but to achieve very high performance (for example, greater than 100 dB) still requires very high accuracy in the DAC thermometer weights.

To overcome this problem, a solution has been proposed by Leung et al (see above) called "individual level averaging," which results in the output spectrum of each bit at the scrambler output being noise-shaped. This noise-shaping causes the error produced by a non-ideal DAC weight to occur only at high frequencies that are above the band of interest. This allows larger errors to occur in the DAC without increasing the in-band noise penalty.

This approach is based on a rotation-type scrambler where a barrel shifter is used as the scrambling block. For an N-bit input with $K=2^N$ thermometer-decode inputs to the scrambler, there are K unique rotations possible. Such a barrel shifter preserves the number of "1's" at the output.

For each of the possible $K=2^N$ thermometer-decoded scrambler input patterns, a memory stores the state of the barrel shifter that was used to map input bits into output bits. Whenever a particular input code is presented to the barrel shifter, the "memory" for that particular input code is examined, and a barrel-shift control word is selected which has not been used yet in the sequence. For example, in the 3-bit case, there are 8 possible input codes and 8 possible barrel-shift positions. For each input code there is a memory that is 7 locations deep. All 7 locations are examined for a particular input code, and whichever barrel-shift code is not found in the memory is used for the current shift control word. This word is then entered in the memory for that particular input code.

This technique guarantees that over a long time period there is no DC error for every possible input code, because all possible barrel-shift locations are used for that input code in the shortest possible time.

The amount of time taken for this sequence to complete for a given code, however, is data-dependent—it depends on the frequency of occurrence of that particular input code. It is quite possible to get very long repeat times, especially for noise shapers with a high number of quantization levels. This tends to produce lower-frequency noise, and reduces the benefit of this technique in comparison to random averaging using the Butterfly scrambler described above. Another serious drawback is that the spectrum of each individual bit output may contain low-frequency noise that degrades the passband signal-to-noise ratio.

One good solution was presented in U.S. Pat. No. 5,404, 142 issued on Apr. 4, 1995, to Robert W. Adams and Tom W. Kwan, which is fully incorporated by reference herein.

The Adams and Kwan patent discloses a data scrambler comprised of an array of swapper cells. The structure of the data scrambler is similar in form to a Fast Fourier Transform (FFT) or Butterfly structure. Each swapper cell in the scrambler tracks its outputs to dynamically balance the number of 1's appearing on each of the swapper cell's outputs. By balancing the number of 1's appearing on the outputs of each swapper cell, the structure disclosed in the Adams and Kwan patent balances the number of 1's appearing on each output of the entire scrambler.

According to the Adams and Kwan patent, each swapper cell can function independently of the others. Each swapper cell can perform the following function:

| 2-State Truth Table | | | | |
| --- | --- | --- | --- | --- |
| INA | INB | CNTA-CNTB | SWAP CTRL | NEW CNTA-CNTB |
| 0 | 0 | 0 | X | 0 |
| 0 | 0 | 1 | X | 1 |
| 0 | 1 | 0 | SWAP | 1 |
| 0 | 1 | 1 | NO SWAP | 0 |
| 1 | 0 | 0 | NO SWAP | 1 |
| 1 | 0 | 1 | SWAP | 0 |
| 1 | 1 | 0 | X | 0 |
| 1 | 1 | 1 | X | 1 |

In the above Truth Table, INA represents input A to the swapper cell, INB represents input B to the swapper cell. CNTA-CNTB represents the history of outputs in the swapper cell, and can be stored as a single bit. SWAP CTRL represents the desired function of the swapper cell for a given INA, INB and CNTA-CNTB. New CNTA-CNTB represents the desired new value for CNTA-CNTB after the current input A and input B have been propagated through the swapper cell. In the table, "X" represents that it does not matter whether input A and input B are swapped.

In one embodiment, CNTA-CNTB represents the number of 1's propagated on output A of the swapper cell minus the number of 1's propagated on output B of the swapper cell. Thus, if CNTA-CNTB is 0, more 1's (or the same number) have appeared on output B than on output A, and the next 1 to be received on input A and input B should be propagated to output A. Conversely, if CNTA-CNTB is 1, more 1's have been output on output A than on output B, and the next 1 should be output on output B.

The Adams and Kwan patent recognizes that the number of 1's need not be counted for output A and output B. Rather, the most recent output to have a 1 (when the other output has a 0) is tracked.

Accordingly, the Adams and Kwan patent discloses a swapper cell as shown in FIG. 7.

SUMMARY OF THE INVENTION

According to one embodiment of the invention, a digital to analog converter system is disclosed. In this embodiment, a data scrambler has an input to receive a thermometer code, the data scrambler including a first swapper cell stage, and one or more subsequent swapper cell stages. A set of connections among the swapper cells in the swapper cell stages are arranged so that at least some of the swapper cells can receive on their inputs thermometer code input bits that have a lower bit position than any thermometer code input bit that can be received on the second input of the swapper cell. The digital to analog converter system also includes a circuit to convert the output of the data scrambler to an analog signal.

According to another embodiment of the present invention, a digital to analog converter system is disclosed. This embodiment includes a data scrambler that has an input to receive a thermometer code input, the data scrambler comprising more than one stage of swapper cells and wherein at least some of the swapper cells comprise a swapper unit, a storage element to store a swap value and a logic circuit to produce a signal defining whether a subsequent input will be swapped, the signal being produced independent of the value of the subsequent input. The digital to analog converter system also includes a circuit to convert the output of the data scrambler to an analog signal.

According to another embodiment of the present invention, a method of using a swapper cell and a data scrambler is disclosed. According to one embodiment of the method, the cell determines whether to swap next input data bits, independent of a value of the next input data bits. The cell receives the next input data bits and propagates those bits, selectively swapping the bits. According to one embodiment of this method, the determination of whether to swap the next input data bits is based on a history of values propagated through the cell. According to another embodiment of this method, the determination of whether to swap bits is performed before those bits are received. According to another embodiment of this method, a step of propagating the bits to outputs of the swapper cell is commenced immediately when the bits are received. According to another embodiment of this method, the bits are propagated through the swapper cell at the same time that a determination of whether to swap subsequently received bits is being made.

According to another embodiment of the invention, a swapper cell is disclosed. According to this embodiment, the swapper cell includes a swapper unit, a storage element to store a swap value and a logic circuit to produce a signal defining whether a subsequent input will be swapped, the signal being produced independent of a value of the subsequent input. According to one embodiment of this swapper cell, the logic circuit is to produce the signal, independent of a value of the subsequent input and based on a history of values propagated through the cell.

According to another embodiment of the invention, a swapper cell is disclosed. According to this embodiment, the swapper cell includes a swapper unit, a first storage element to store a current swap value and a second storage element to store a next swap value. According to one embodiment of this swapper cell, the first storage and second storage elements are clocked out of phase.

According to another embodiment of the invention, a data scrambler is disclosed. According to this embodiment, the data scrambler includes a first swapper cell stage and one or more subsequent swapper cell stages. This embodiment also includes a set of connections among the swapper cells of the first and second stages, the connections being arranged so that at least some of the cells can only receive on one input a signal passed from a lower bit position than any bit position corresponding to a signal that can be passed to the swapper cell's second input.

According to another embodiment of the present invention, a data scrambler is disclosed. According to this embodiment, the data scrambler includes a first swapper cell stage and one or more subsequent swapper cell stages. According to this embodiment, the scrambler includes a set of connections among the swapper cells in the swapper cell stages, the connections being arranged so that when a thermometer code input is presented on the primary inputs to the first swapper cell stage, at least one of the swapper cells in the subsequent swapper cell stages can receive as a digital input fewer than all possible digital inputs for the swapper cell.

According to another embodiment of this invention, a data scrambler is disclosed. According to this embodiment, the data scrambler has more than one type of swapper cell.

DETAILED DESCRIPTION

For the reasons explained below, there remains a need for a minimum delay data shuffler with noise-shaping characteristics. The Adams and Kwan patent does provide a useful structure. The Adams and Kwan patent recognizes that first order noise-shaped shuffling can be implemented in a segmented DAC by building up multiple stages of swapper cells, each of which operates independently of the swapper cells around it. The structure is similar in form to an FFT structure. Because of this regularity, the structure of the Adams and Kwan patent lends itself well to optimized layout efforts.

Figure 7:
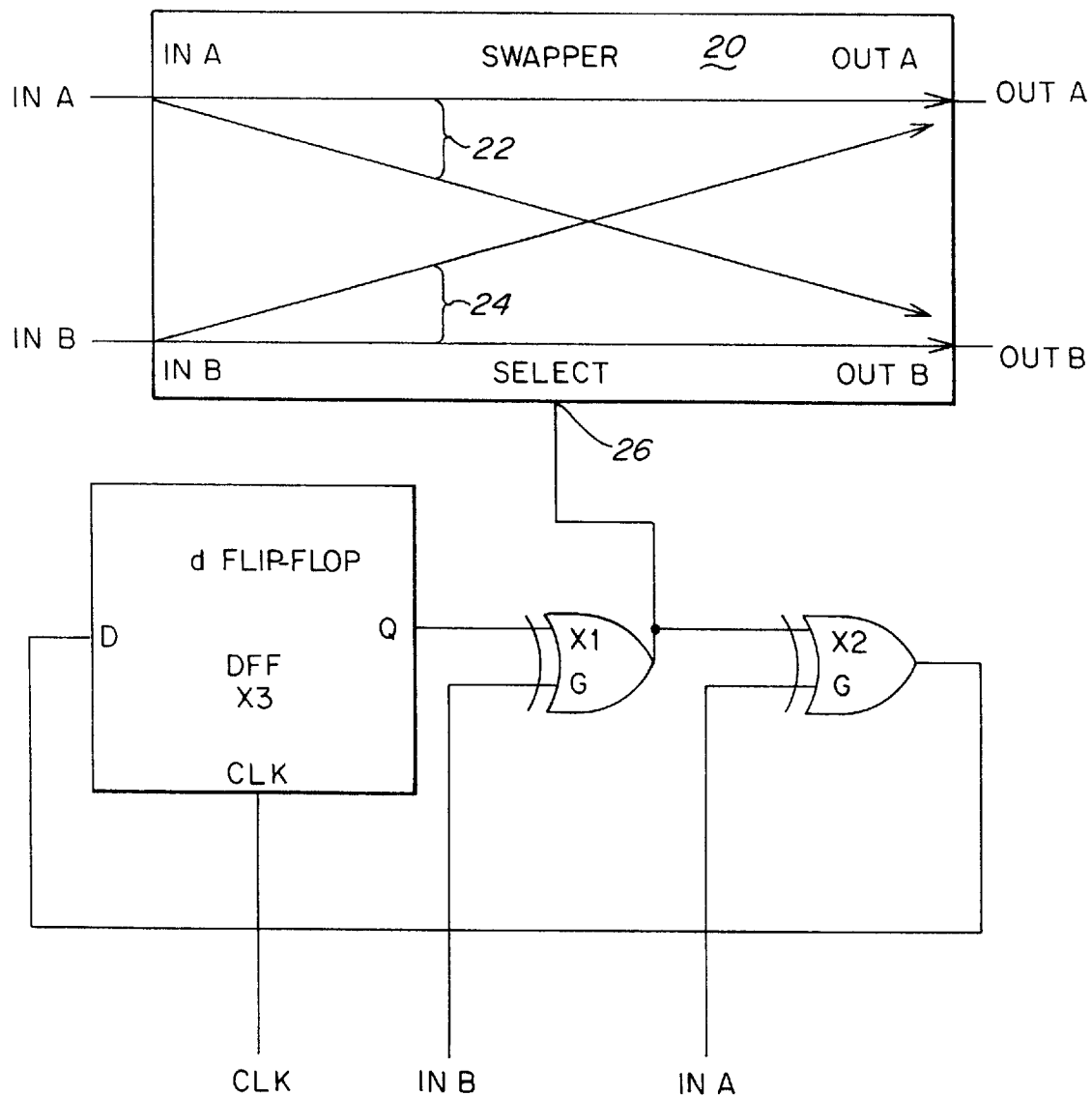
FIG. 7 shows a conventional swapper cell controlled by data-directed logic.

The structure of the Adams and Kwan patent also has the advantage that the disclosed data shuffler can be given any segmented bit pattern (i.e., a bit pattern where each bit has the same weight) as an input. Each swapper cell evaluates its pair of inputs and "history bit" (e.g., CNTA-CNTB) held in latch X3. This history bit is based on how previous data has passed through the cell (see FIG. 7). Control logic then determines whether the current input data should be swapped or not, sets the swapper control line and updates the "history bit" in the latch X3 (if appropriate).

The structure disclosed in the Adams and Kwan patent, however, has some logic delay associated with each swapper cell. This is necessary because the swapping decision is made based in part on the current input bits.

Figure 8:
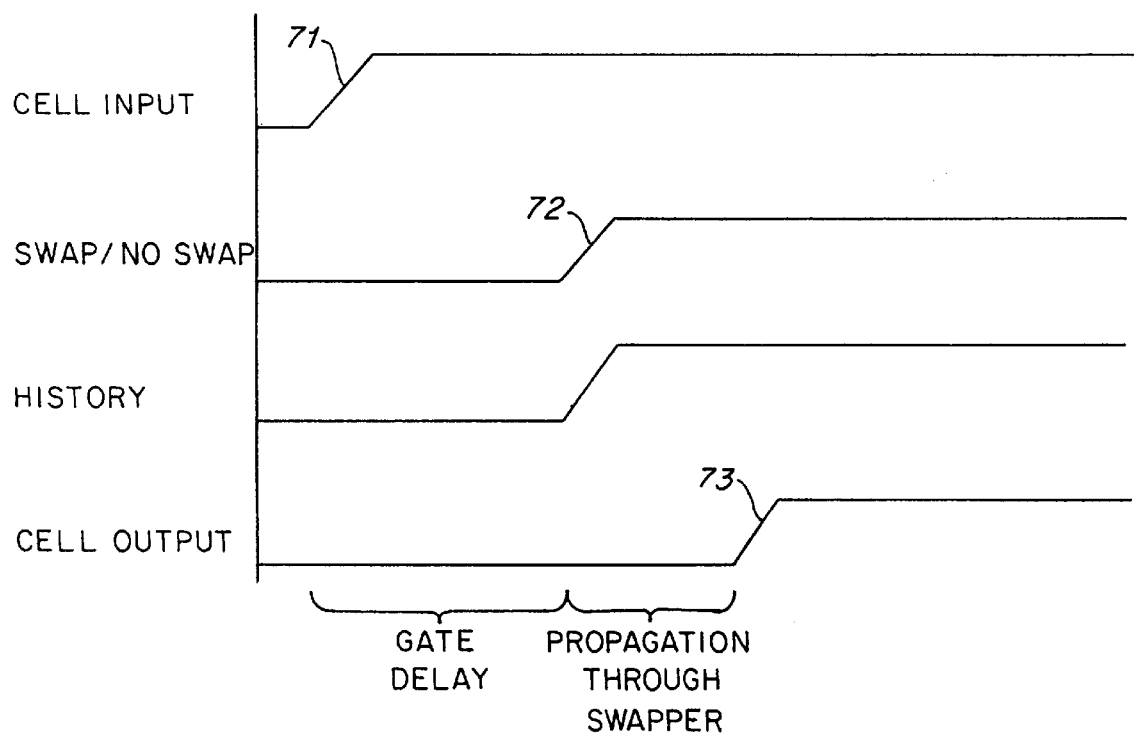
FIG. 8 illustrates a timing diagram for the swapper cell of FIG. 6.

FIG. 8 illustrates a timing diagram through a swapper cell according to the Adams and Kwan patent. As shown, a cell input is present on a swapper cell at a time 71. Due to a gate delay (i.e., through latch X3 and gate X1 in FIG. 7), the swap/no swap signal does not become valid until a later time 72. After the swap/no swap signal has reached its stable output, the inputs then propagate through the shuffler. Thus, the cell output signal is not valid until a later time 73.

Accordingly, in practice, there is a ripple delay of at least a few logic gates through each swapper cell in the scrambler. This creates an overall delay through the entire scrambler structure of N times the delay for one cell (one cell delay), where N is the number of stages in the scrambler (i.e., a scrambler for $2^N$ thermometer code input bits).

Figure 1A:
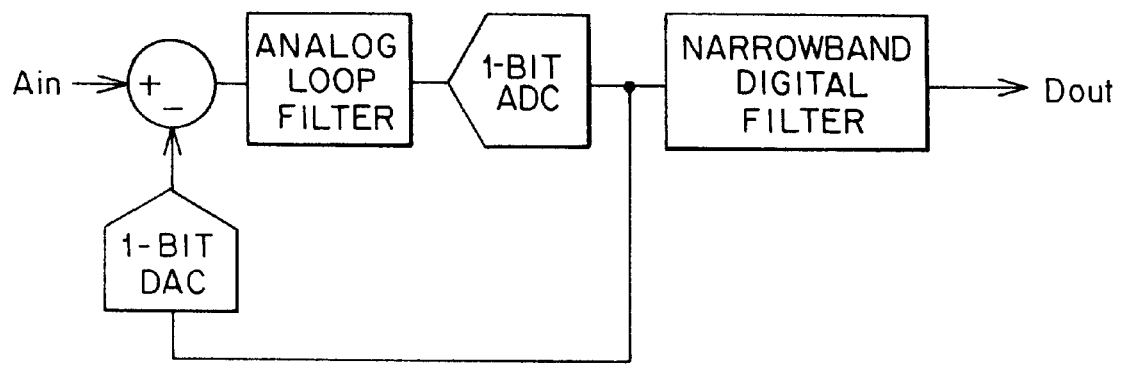
FIG. 1A illustrates a conventional 1 bit Sigma-Delta ADC.
Figure 1B:
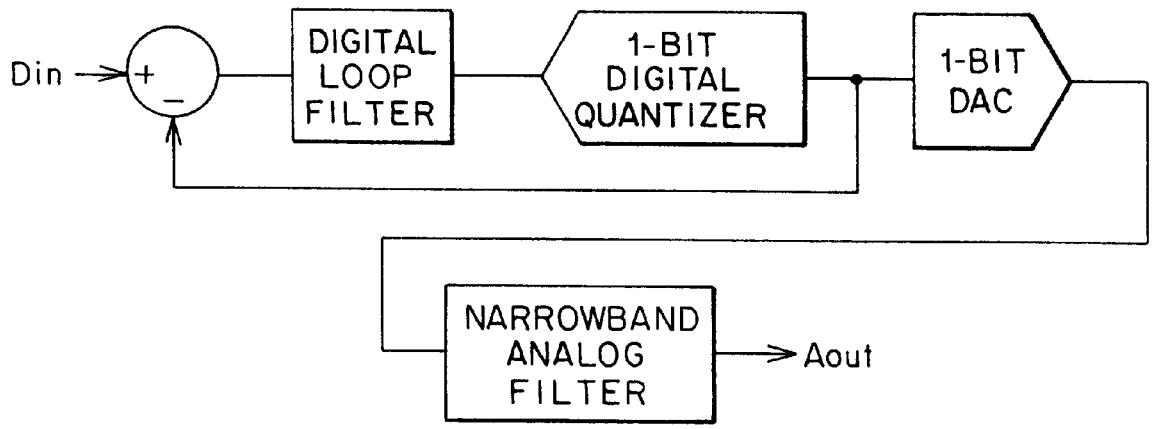
FIG. 1B illustrates a conventional 1 bit Sigma-Delta DAC.
Figure 2A:
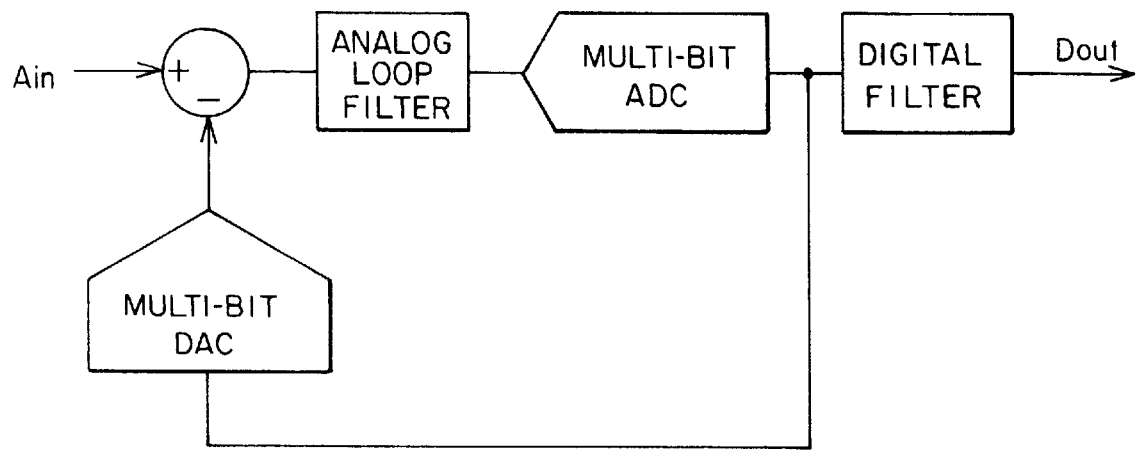
FIG. 2A illustrates a multi-bit Sigma-Delta ADC.
Figure 2B:
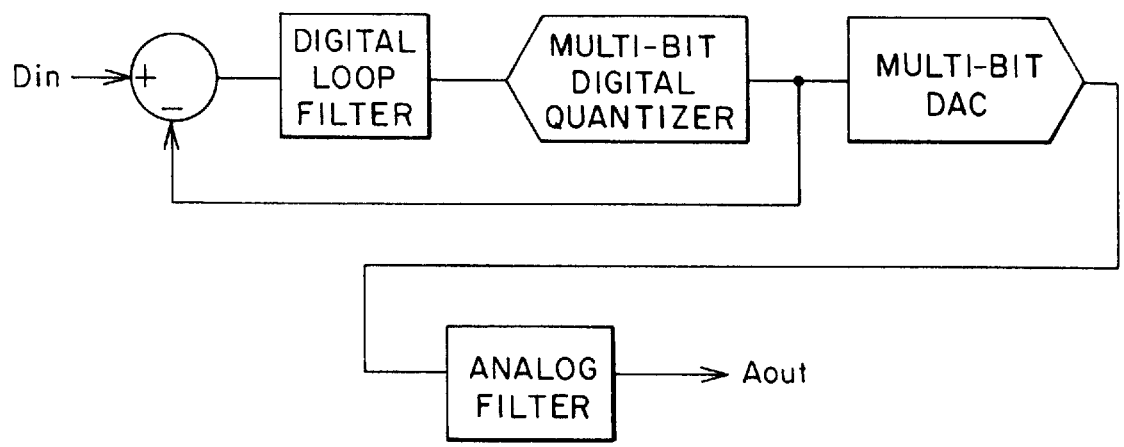
FIG. 2B illustrates a multi-bit Sigma-Delta DAC.
Figure 3:
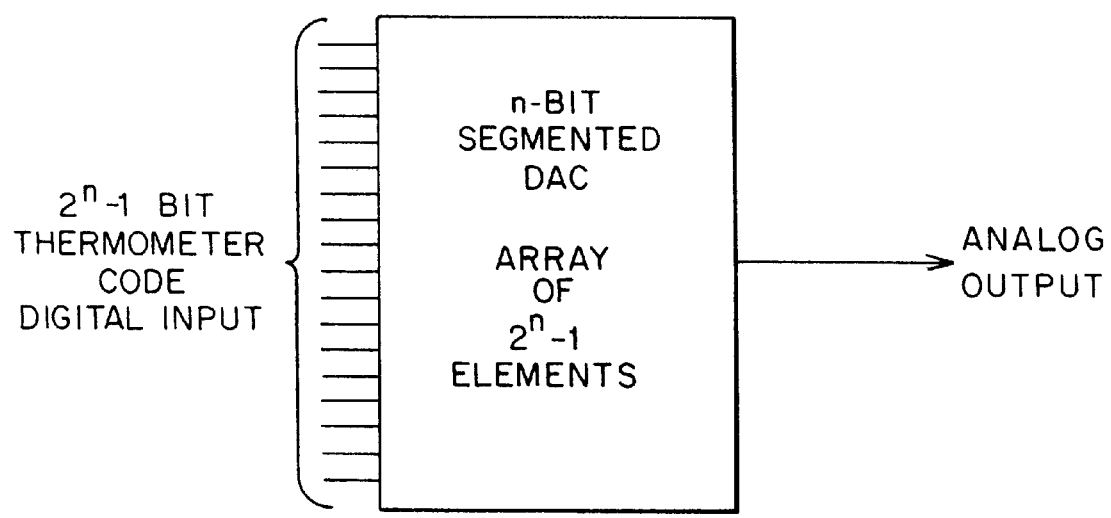
FIG. 3 illustrates a segmented DAC.
Figure 4:
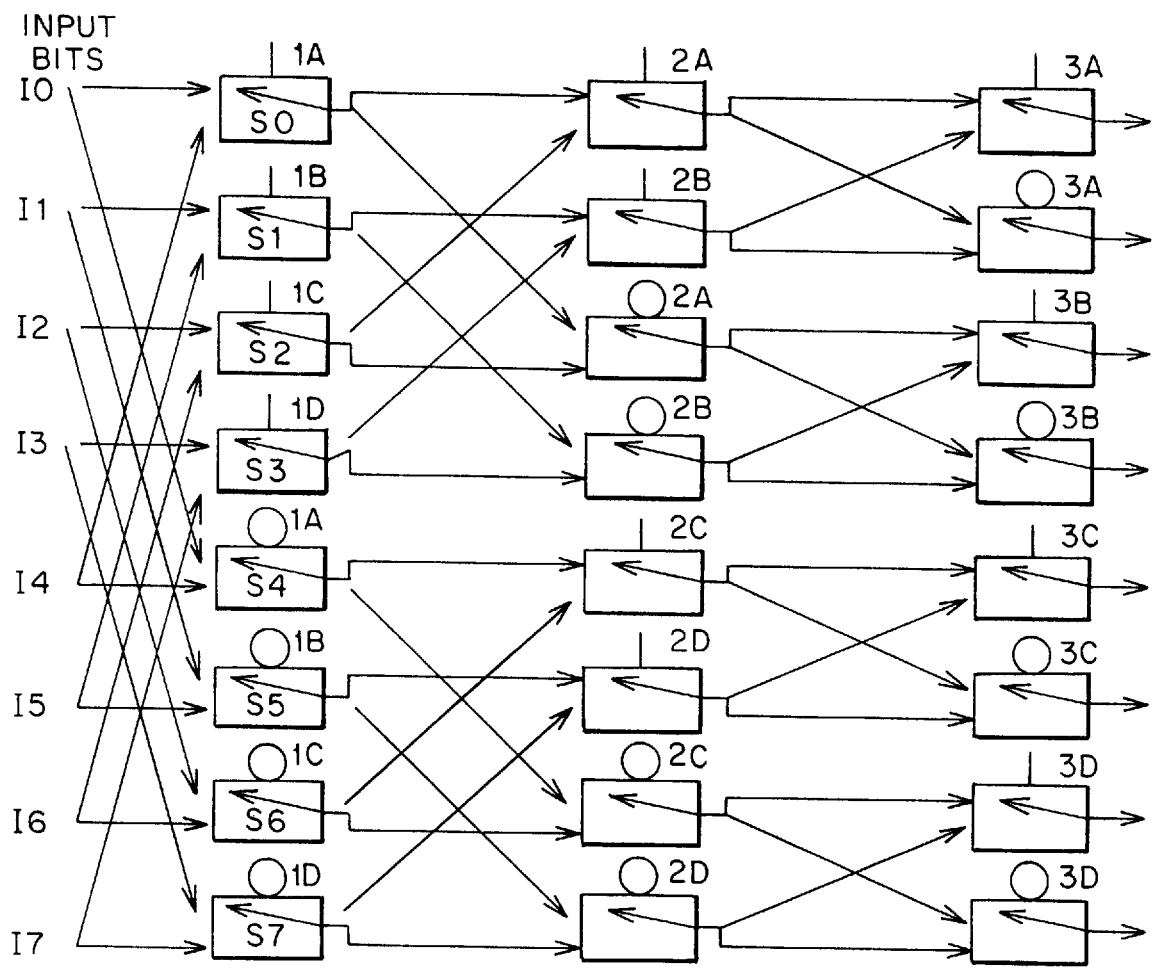
FIG. 4 illustrates a diagram of a Butterfly scrambling switching structure.
Figure 5:
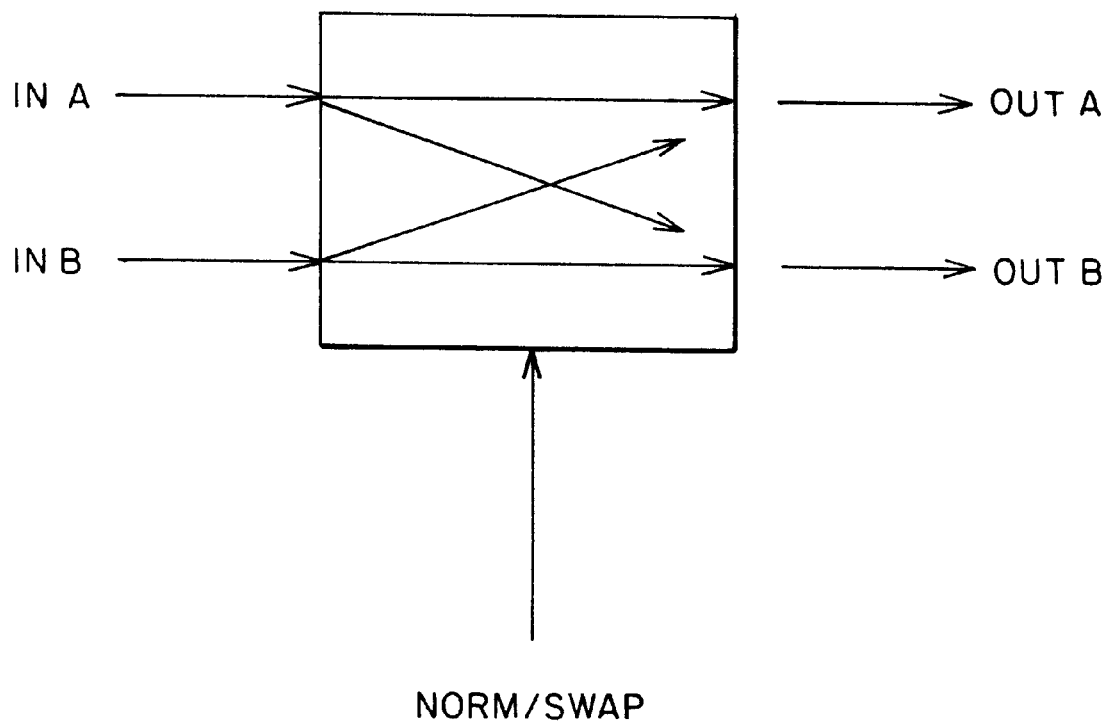
FIG. 5 illustrates a conventional swapper cell in block format.

In some applications, this delay can prove quite problematic. For example, these delays may be unacceptable in a feedback DAC used in a Sigma-Delta analog-to-digital converter (ADC), as shown in FIG. 2A. In this case, the DAC operation is part of a feedback loop and delay through the DAC should be minimized (as in the systems disclosed in the U.S. patent application entitled High-Speed Sigma-Delta ADCs, attorney file number A0312/7265, with Todd L. Brooks and David Robertson as named inventors, filed on even date herewith, which application is commonly owned and is hereby incorporated by reference in its entirety, and the U.S. patent application entitled Multi-Bit Feedback DAC for High-Speed ADCs, attorney file number A0312/7275, with Todd L. Brooks and David Robertson as named inventors, also filed on even date herewith, which application is also commonly owned and is hereby incorporated by reference in its entirety). The DAC operation must include any shuffling that is performed as a part of the digital-to-analog conversion, as well as any DAC settling. In converters running at high clock rates, such as 10 MSPS or above, this can leave only 2–3 nanoseconds of the timing budget for shuffling or scrambling.

Accordingly, one objective of the invention is to produce a scrambler structure that has the area and circuit efficiency of the data scrambler disclosed in the Adams and Kwan patent. Another objective of the present invention is to produce a data scrambler that can perform the noise-shaped data scrambling, but with lower delays through the scrambler structure.

Swapper Cells

According to one embodiment of the present invention, decreased delay through the scrambler can be achieved by structuring the scrambler and the swapper cells such that the swap/no swap decision at each cell is made before the next input data arrives. Accordingly, the only delay through the swapper cell that must be incurred is the propagation delay through the cell—without delay caused by propagation of signals through control logic gates. One manner in which this counterintuitive result can be achieved may be explained as follows.

Again referring to the structure disclosed in the Adams and Kwan patent, described above, the swapper cell is arranged to handle all four possible inputs to the swapper cell: 00, 01, 10 and 11.

In one embodiment of the present invention, the data scrambler is structured so that the input to each swapper cell can assume one of only three possible inputs: 00, 01 and 11. (Of course, in alternative embodiments, three different possible inputs could be selected, such as 00, 10 and 11. Indeed, not every swapper cell needs to have its inputs limited to the same three possible inputs, e.g., one swapper cell may receive only 00, 01 and 11 on its inputs while another swapper cell receives only 00, 10 and 11 on its inputs. The remainder of the detailed description will assume that the three possible inputs selected for each cell are 00, 01 and 11.) Thus, the input to each swapper cell is restricted to be a thermometer code input of 2 bits. Given this structure of the data scrambler, each swapper cell may be implemented to perform the following function:

| INA | INB | HISTORY | SWAP CTRL | NEW HISTORY |
|-----|-----|---------|-----------|-------------|
| 0 | 0 | X | X | SAME |
| 0 | 1 | 0 | SWAP | TOGGLE |
| 0 | 1 | 1 | NO SWAP | TOGGLE |
| 1 | 0 | X | X | X |
| 1 | 1 | X | X | SAME |

As can be seen from the table, when the input is 00 or 11, it does not matter if the cell swaps or passes through data.

The only restriction in this case is that the new history for the cell be the same as the previous history. For an input of 01, if the history bit is 0, the data should be swapped; if the history bit is 1, the data should not be swapped. In both cases, the new history should toggle from the preceding history (i.e., a history of 0 should result in a new history of 1 and vice versa). For an input of 10, the performance of the swapper cell is immaterial because this is an invalid input, as described above.

Accordingly, the swap control can be set at a value based only on the current value of the history bit—independent of the values of input A and input B. The current values of input A and input B only impact what the value of the new history will be.

Thus, the swap control function can be determined based only on a history bit. Accordingly, no logic elements would be required to set the swap control based on the current inputs. The only logic elements that would be required would be to set the new history value, based on the inputs and the old history value. This permits the input values to propagate through the logic to determine the new history value at the same time that the thermometer code data values are propagating through the swapper cell. Thus, propagation through the swapper cell is not delayed by logic elements.

Figure 9:
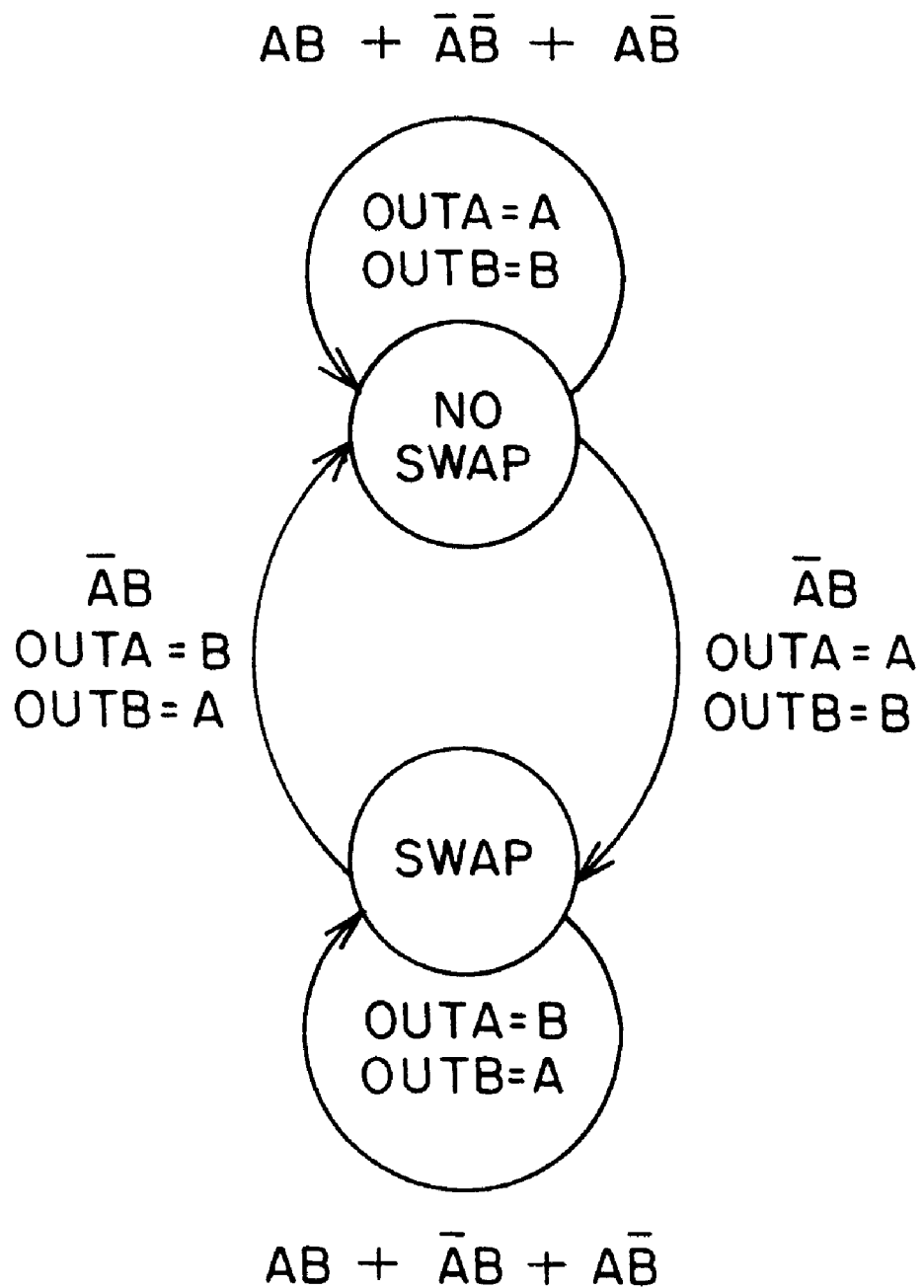
FIG. 9 illustrates a state diagram of a swapper cell according to one embodiment of the present invention.

FIG. 9 illustrates a state diagram for one embodiment of control of a swapper cell. As shown, the swapper cell can exist in one of two states—no swap and swap. In the state diagram, the swapper cell can have an input A and an input B. On the state diagram, the outputs OUTA and OUTB are also indicated. When the swapper is in the "no swap" state, OUTA will always be A and OUTB will always be B, no matter what the input is. Similarly, when the swapper is in the "swap" state, OUTA=B and OUTB=A, no matter what the input is.

Depending on the inputs, the swapper cell may change (and the history bit toggle) from one state to the other. In particular, when an input of 01 is received, the swapper cell changes states (and the history bit toggles). Although the diagram illustrates that when an input of 10 is received the swapper stays in the same state, an input of 10 is not a valid input, as discussed above.

Figure 10:
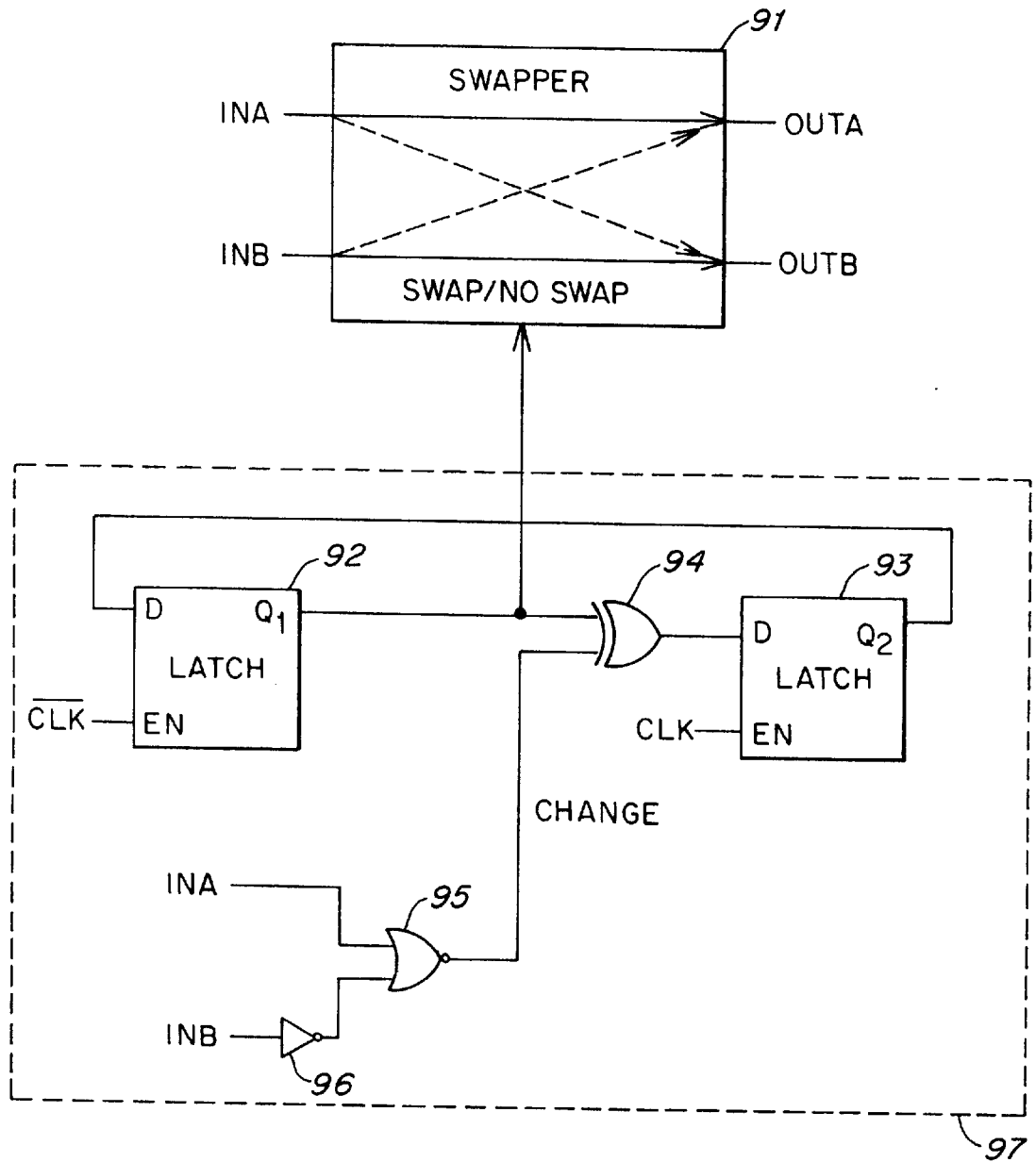
FIG. 10 illustrates a block level diagram of a swapper cell according to one embodiment of the present invention.

FIG. 10 illustrates a swapper cell according to one embodiment of the present invention. A swapper unit 91 takes two inputs INA and INB. Based on a select input, the swapper passes through or swaps the inputs INA and INB to outputs OUTA and OUTB.

Logic circuit 97 controls whether the swapper passes through or swaps the data signals for propagation to the outputs, OUTA and OUTB. A latch 92 stores the current history bit for the swapper cell, as described above. Latch 92 is clocked on the inverse of a master clock signal, CLK. Thus, when data is clocked into the data scrambler and propagates through lines INA and INB, the output of latch 92, $Q_1$, remains latched.

Latch 93 stores the new history bit to be used in propagation of the next set of data values. Inverter 96 and NOR gate 95 provide a change signal. The change signal is high only when input A is 0 and input B is 1. The change signal is input to an exclusive OR gate 94. When the change signal is high, the exclusive OR gate 94 causes the input to latch 93 to be the inverse of the current output of latch 92. When the change signal is 0, the exclusive OR gate 94 passes through the current output of latch 92 to the input of latch 93. As shown, latch 93 is clocked off of the master clock signal.

Thus, the timing of the swapper cell illustrated in FIG. 10 may be described as follows. When CLK is high, the input data, INA and INB, propagates through the swapper 91. At the same time, inputs INA and INB propagate through the logic elements 94, 95 and 96 to the input to the latch 93. The state of the swap/no swap signal does not change while CLK is high. The swap/no swap signal only changes state during the following clock phase, when CLK is low. Accordingly, any change in values of INA and INB does not affect the present state of the swapper cell. It only affects the state of the swapper cell for the next clock cycle. As can be appreciated, this is achieved by clocking the two latch 92 and 93 out of phase (on CLK and $\overline{CLK}$).

Figure 11:
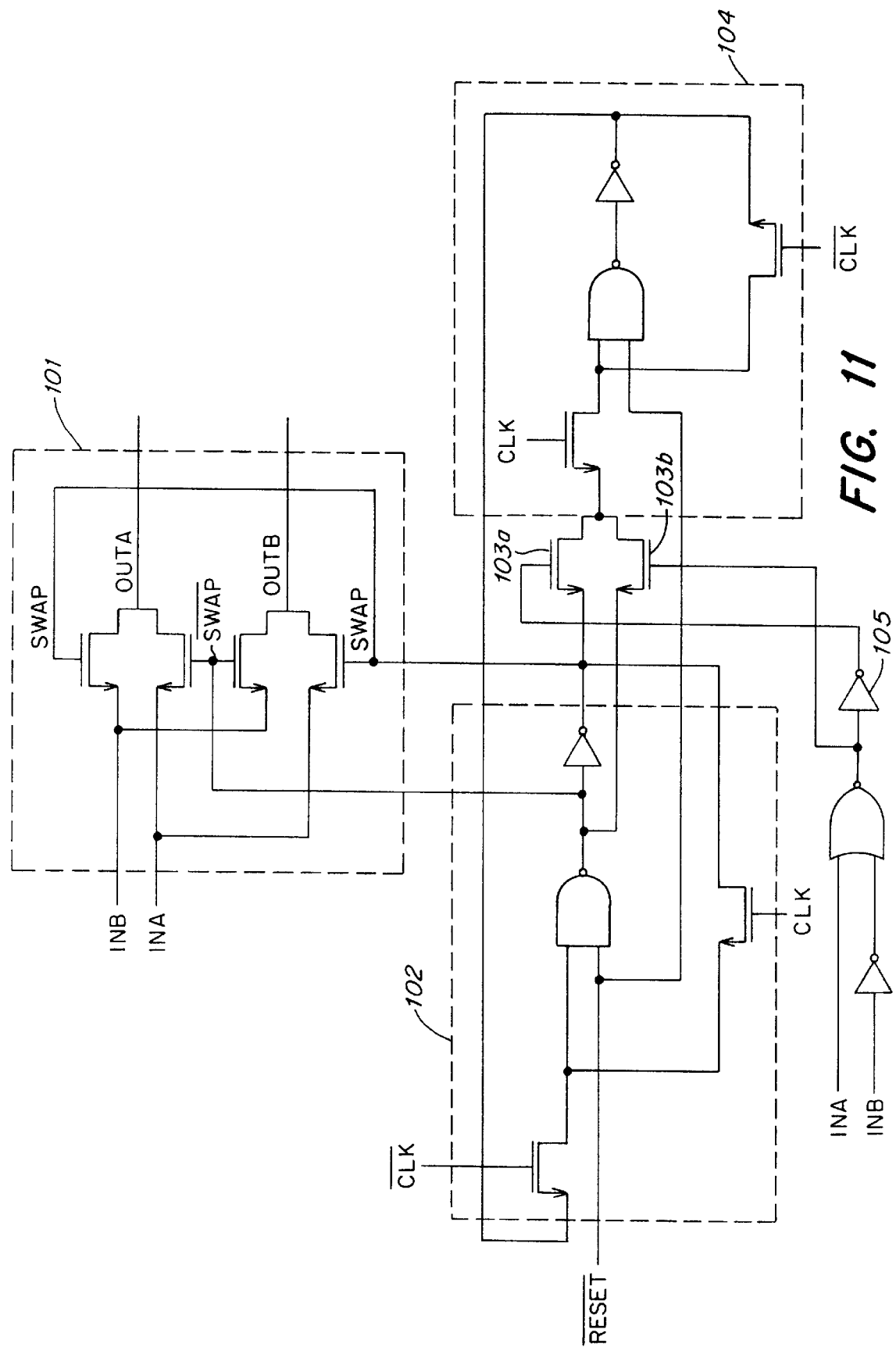
FIG. 11 illustrates a gate level diagram of a swapper cell according to one embodiment of the present invention.

FIG. 11 is a circuit level diagram of one embodiment of a swapper cell according to the present invention. The swapper 101 is composed of four transistors, as shown. Latch 92, as shown in FIG. 10, is implemented using the circuit diagram shown at 102. The exclusive OR gate is implemented using transistors 103*a* and 103*b*, together with inverter 105. Latch 93, as shown in FIG. 10, is implemented using the logic circuit disclosed at block 104. Thus, the circuit performs as generally described with reference to FIG. 10. FIG. 11 includes circuitry to use an inverted RESET signal, permitting the latches to be put into a known state.

Data Scrambler Structure

As discussed above, a particularly fast swapper cell can be implemented where the format of the data inputs has been restricted—in the case above, the inputs were limited to 00, 01 and 11.

Figure 6:
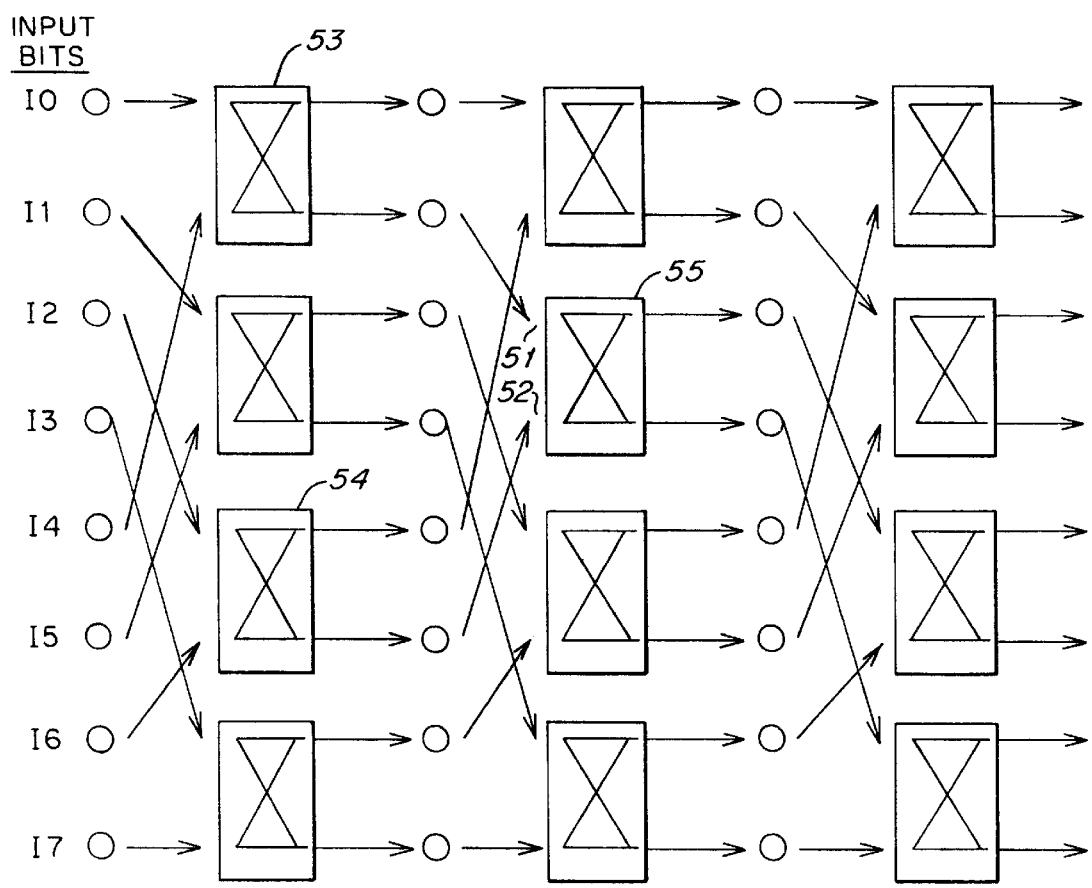
FIG. 6 illustrates a conventional data scrambler formed of three sets of interconnected swapper cells.

This will work in the first stage of a thermometer code shuffler such as the one disclosed in the Adams and Kwan patent. After the first stage of shuffling, however, the thermometer code format has been scrambled. Accordingly, in the data scrambler disclosed in the Adams and Kwan patent, swapper cells after the first stage may see any one of the four possible inputs: 00, 01, 10 and 11. For example, referring again to FIG. 6, swapper cell 53 may be set to pass through data inputs (i.e., not to swap). In this case, bit 14 would be present on the top input of swapper cell 55, shown at 51. If swapper cell 54 is set to swap, then input bit 12 will be passed to the lower input of swapper cell 55, shown at 52. Thus, swapper cell 55 will have input bit 14 at its top input and input bit 12 at its lower input. Accordingly, the input to swapper cell 55 may be 10.

Based on the disclosure provided herein, however, functionally equivalent data scramblers may be implemented that do preserve the thermometer code input aspect to each swapper cell.

Figure 12A:
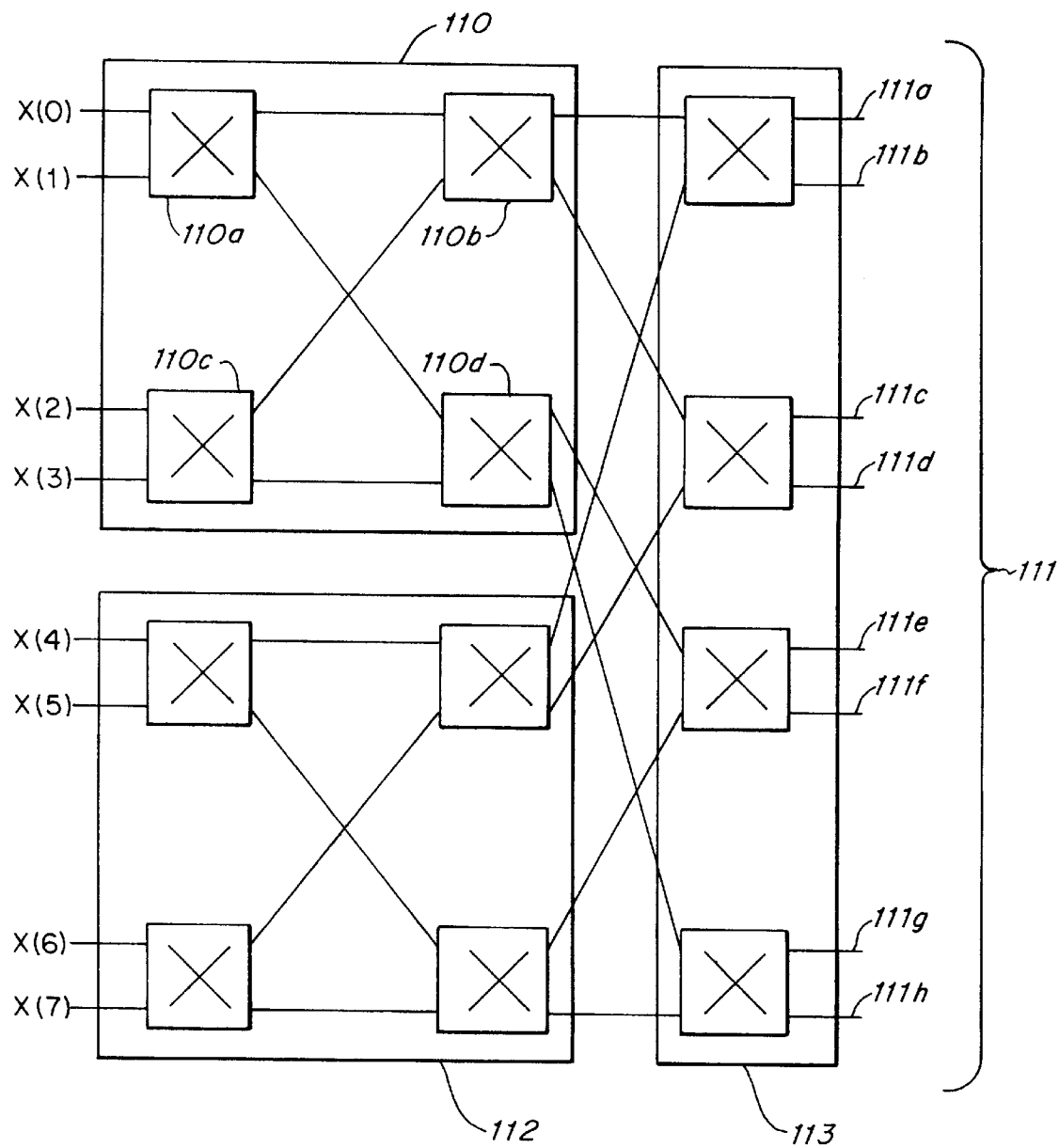
FIG. 12A illustrates a set of interconnections among swapper cells in a data scrambler according to one embodiment of the present invention.

FIG. 12A illustrates one data scrambler structure that achieves this result.

Figure 12B:
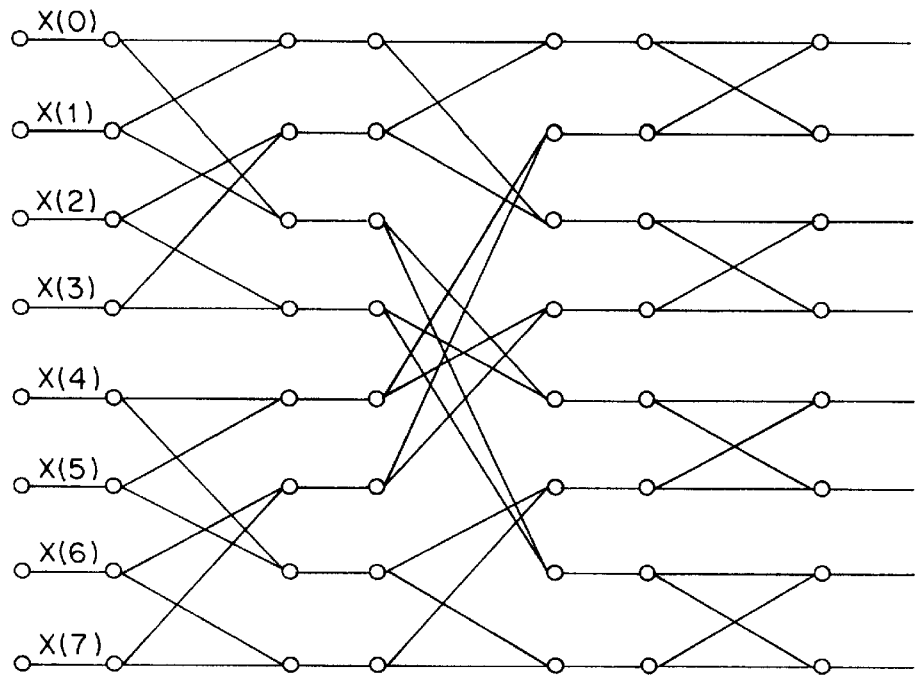
FIG. 12B illustrates a Butterfly diagram for the data scrambler of FIG. 11A.

FIG. 12B shows the equivalent FFT Butterfly diagram for the scrambler illustrated in FIG. 12A.

The scrambler illustrated in FIGS. 12A and 12B takes 8 thermometer code bits for input (e.g., decoding of a 3 bit binary word). Based on the disclosure provided herein, data scramblers may be built for other numbers of input bits. For example, a 2 bit binary word would correspond to a 4 bit thermometer code input. The interconnections among swapper cells 110*a*, 110*b*, 110*c* and 110*d* of FIG. 12A would implement a data scrambler that preserves thermometer code input bits at each swapper cell. Of course, the data scrambler of FIG. 12A could be used for a 3 bit binary input (8 bit thermometer code input).

Data scramblers for larger inputs can be configured as follows. Consider construction of a data scrambler for an N-bit binary input having $K=2^N$ thermometer decode input bits. To construct this data scrambler, design begins with two data scrambler structures for an (N-1)-bit binary input or $K=2^{N-1}$ thermometer decode input bits. This smaller data scrambler can be constructed in the same fashion, beginning with the 2-bit binary input, or 4-bit thermometer code input, data scrambler illustrated in FIG. 12A 110a–110d. The two $K=2^{N-1}$ bit data scramblers are positioned above each other. An additional column of $2^{N-1}$ swapper cells are placed to receive on their inputs the outputs of the two smaller data scramblers. The inputs of this last column (stage) of swapper cells may be connected to the outputs of the earlier smaller data scramblers as follows. The outputs from the upper, smaller data scrambler are all connected to the top output of one of the swapper cells in the added, last stage. The outputs of the bottom smaller data scrambler are connected to the bottom input on each of the swapper cells of the last, added stage of cells.

This process can be explained with reference to FIG. 12A. In this case, the 3-bit binary input (8-bit thermometer code input) data scrambler is constructed from two smaller 2-bit binary input (4-bit thermometer code input) data scramblers. A first 4-bit thermometer code input data scrambler 110 is positioned at the top of the complete data scrambler 111. A second 4-bit thermometer code input data scrambler 112 is positioned below the first such data scrambler 110. An additional stage of swapper cells 113 are added. Each of the outputs from the first smaller data scrambler 110 is connected to the top input of a swapper cell in the last stage 113. Each of the outputs of the lower smaller data scrambler 112 is connected to the lower input of a swapper cell in the last stage 113. Because inputs X(0)–X(3) can be scrambled only to be received as a top input of a swapper cell in stage 113 and input bits X(4)–X(7) can only be received on a lower input of a swapper cell in stage 113, the upper input of the swapper cell in 113 will always receive an input having on its upper input a lower bit number position than any input received on that swapper cell's lower input. (Of course, "upper," "lower," are convenient references to describe the connection in FIG. 12A, but are not intended to be limiting.)

Figure 12C:
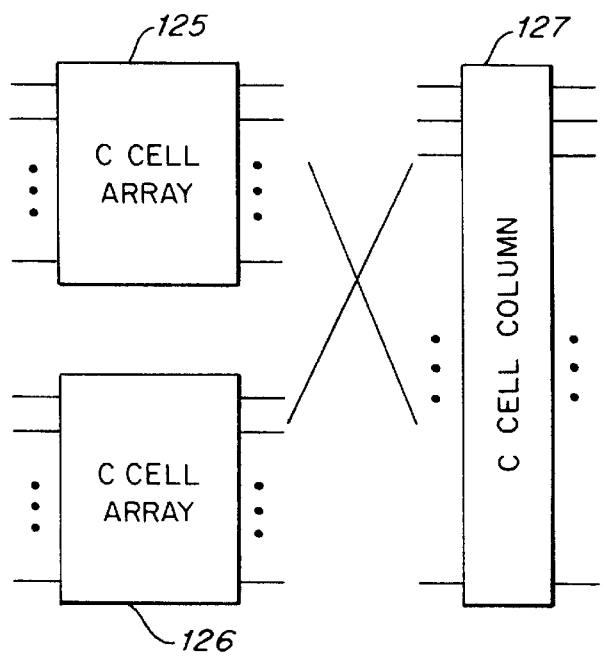
FIG. 12C illustrates an example of hierarchically organizing a data scrambler.

A generic method of organizing a data scrambler that limits inputs may be described with reference to FIG. 12C. A first array of $C=2^N$ swapper cells 125 is provided that limits inputs to three states (e.g., 00, 01 and 11), as described above. This array has C thermometer code inputs and C outputs. The first array of swapper cells 125 may be constructed according to the same generic method described in this paragraph, and beginning with a four cell swapper, such as indicated at 110 in FIG. 12A. A second array of C swapper cells 126 is provided, constructed in similar fashion to the first array (the exact interconnections need not be the same). A column of C swapper cells 127 is then provided. The inputs of column 127 are coupled to the outputs of arrays 125, 126 as follows. Each output of array 125 is connected to the top input of a cell (any cell) of column 127. Each output of array 126 is connected to the bottom input of a cell (any cell) of column 127. The completed array is a $2^{N+1}$ cell data scrambler having $2^{N+1}$ inputs and $2^{N+1}$ outputs and that limits the inputs to each cell to 00, 01 and 11 when a thermometer code is present on the input to the complete array.

Figure 13:
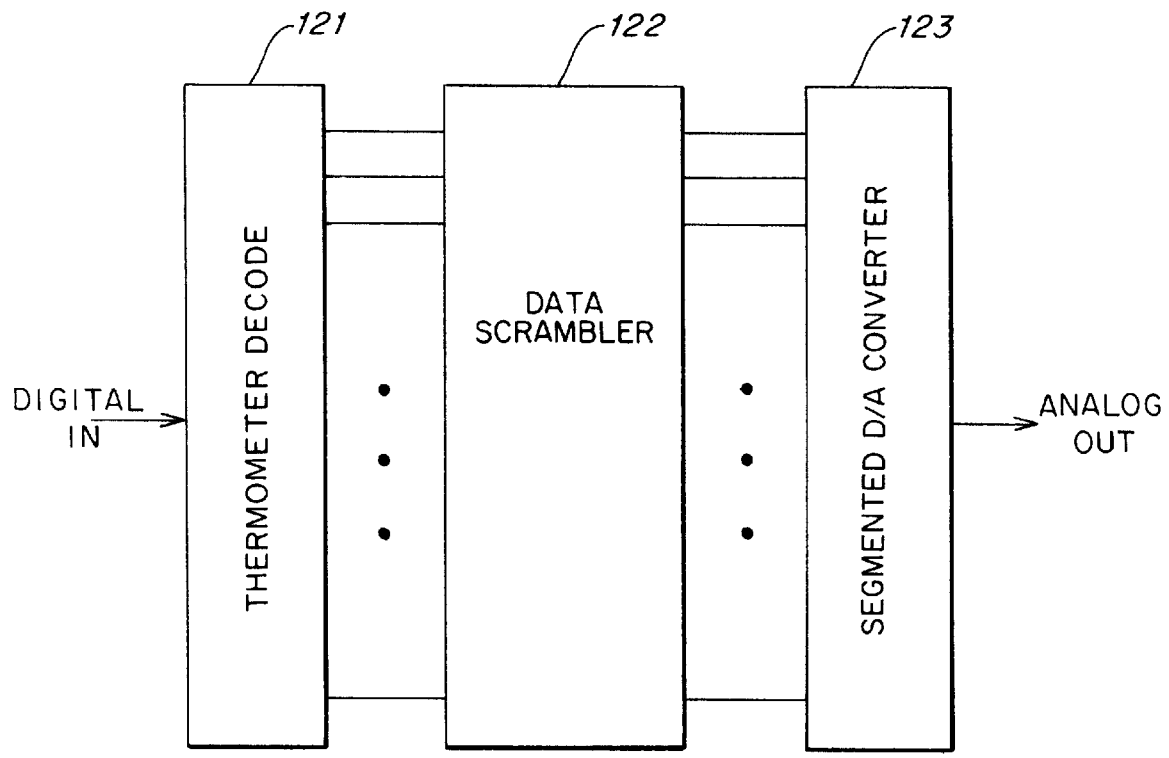
FIG. 13 illustrates a digital to analog converter according to one embodiment of the present invention.

FIG. 13 illustrates one embodiment of a DAC according to the present invention. A digital input is provided to a thermometer decode circuit 121. A data scrambler 122, according to one of the embodiments described above, scrambles the decoded input. The data scrambler 122 provides a scrambled thermometer code input to a circuit 123 that converts the scrambled segmented digital signal into an analog signal. The segmented DAC 123 may include an element of equally weighted elements and operational amplifier circuit or any other circuit that implements this function.

In some circumstances, the design of the data scrambler can be optimized to decrease propagation delays through the scrambler. For example, the data scrambler may receive on its inputs the output from a flash analog to digital converter (flash ADC), which provides thermometer code output data. One such application is use of a DAC according to the present invention in a feedback loop of an analog digital converter for a high speed Sigma-Delta application, as disclosed in the U.S. patent application entitled High-Speed Sigma-Delta ADCs, attorney file number A0312/7265, with Todd L. Brooks and David Robertson as named inventors, filed on even date herewith, which application is commonly owned and is hereby incorporated by reference in its entirety, and the U.S. patent application entitled Multi-Bit Feedback DAC for High-Speed ADCs, attorney file number A0312/7275, with Todd L. Brooks and David Robertson as named inventors, also filed on even date herewith, which application is also commonly owned and is hereby incorporated by reference in its entirety.

In this application, the input of the data scramblers may be provided from a flash ADC which provides thermometer-code data. The flash ADC may have a plurality of comparators 131a of FIG. 14, to provide the thermometer code data. This type of comparator often operates in two phases: a reset phase and a regeneration phase. During the reset phase, all of the comparator outputs are held at the same level, e.g., at a high logic level. During the regeneration phase, the outputs settle to reflect their final value, based on a comparison of the input voltage to a reference voltage. Thus, all of the comparator outputs may be high during the reset phase, with only some of the outputs falling to the low state during the regeneration phase.

In this circumstance, delay through the transistors in a swapper cell can be reduced by using elements that transition quickly in one direction. For example, if the input to the swapper cell is high during the reset phase, an element that transitions quickly from high to low will reduce delay through the cell—the high to low transition of the comparator during its regeneration phase is quickly followed by the element. Conversely, the transition from low to high is unimportant—this transition takes place during the reset phase of the flash ADC. Accordingly, gates can be designed for the swapper cells that have skewed transition times—favoring either the low to high or the high to low transition time, depending on the input to the data scrambler.

Figure 14:
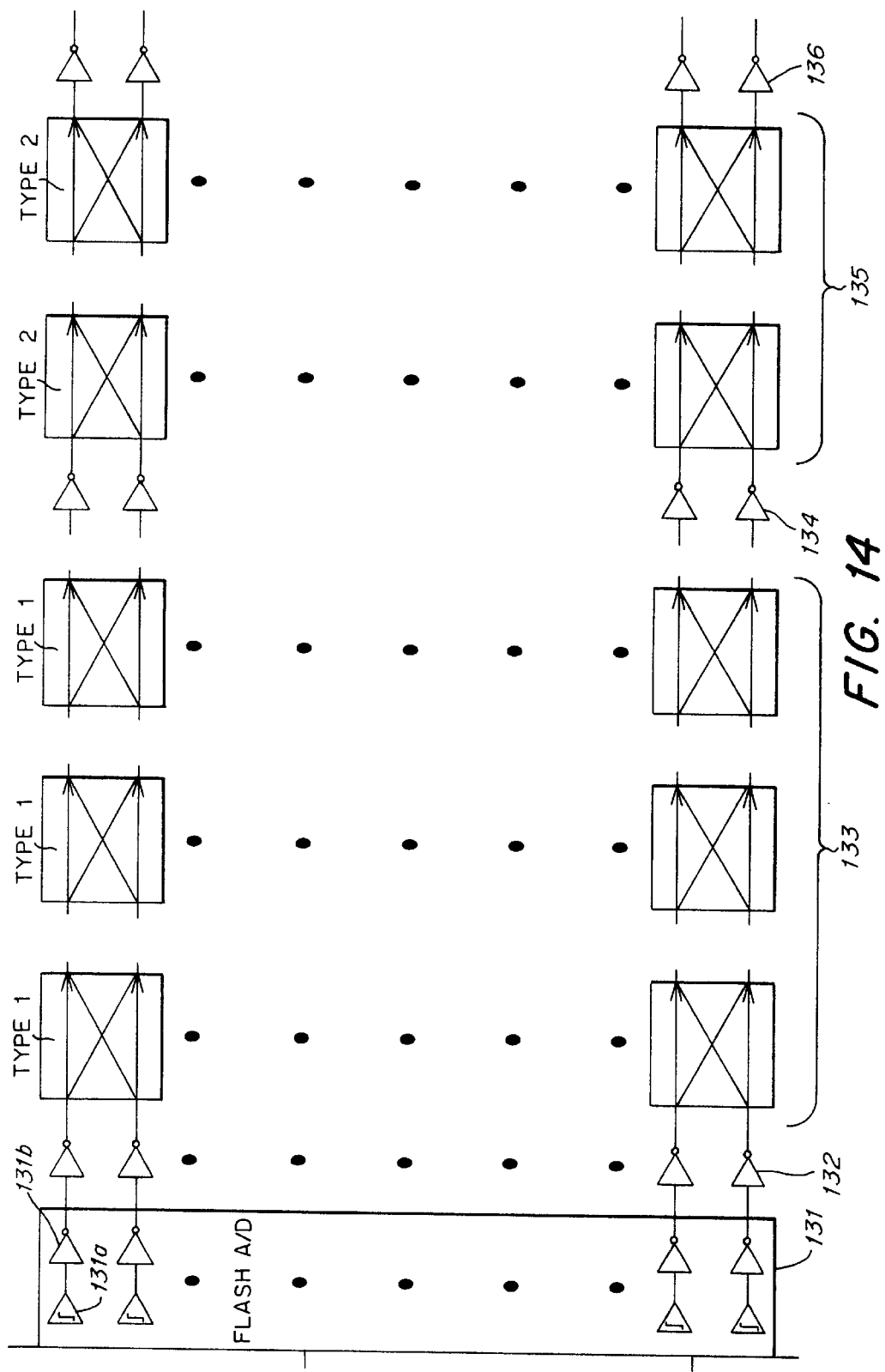
FIG. 14 illustrates one embodiment of a data scrambler having more than one type of swapper cell.

FIG. 14 illustrates a data scrambler according to one embodiment of the present invention, having a 32-bit thermometer code input. In FIG. 14, the ellipses represent that their would be 16 rows of swapper cells. The interconnections among the swapper cells would be constructed as described above.

The data scrambler receives an input from flash analog to digital converter 131. The flash ADC includes flash comparators 131a that reset to a high logic level. The flash ADC 131 includes inverters 131b to buffer the output of the flash ADC 131. Preferably, the inverters 131b inside of the flash ADC 131 are implemented to have a fast rise time (and a slow fall time, i.e., when the comparator output falls from the high logic level at the reset to a low logic level during a regeneration phase, the output of the inverter quickly rises from its low level to a high level).

Each swapper cell has switch resistance which operates in conjunction with the switch parasitic capacitance and metal interconnect parasitic capacitance to cause a distributor RC delay in the shuffler. This delay may be reduced by buffering the signal using an inverter, after it has gone through one or more columns of swapper cells. These inverters also add delay and additional parasitic capacitance to the signal path, however. For this reason, inverters may be undesirable for use after every swapper stage. The inverters, however, keep the number of series switches in the shuffler from growing too large and they buffer the parasitic capacitance in later stages from the switch resistance in earlier stages. The net effect, of inserting inverter buffers, therefore, is to keep the distributed RC delay from growing too large. Of course, optimum placement of inverters depends upon the number of columns of swapper cells and the specific process parameters of the technology used to implement the data scrambler. In the 32-bit thermometer code input data scrambler illustrated in FIG. 14, a column of inverters 132 receives the output of the flash ADC 131 and drives the inputs to the data scrambler. These inverters are intended to drive the parasitic capacitance of the swapper cells 133. The inverters 132 are preferably implemented to have a fast fall time and a slow rise time. A column of inverters 134 between the third and fourth stages of swapper cells drives the last two stages 135.

Figure 15A:
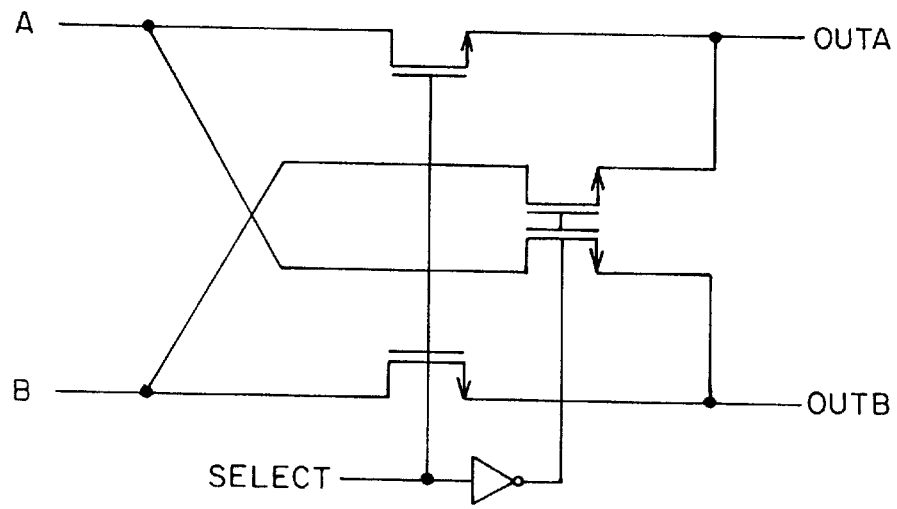
FIG. 15A illustrates one embodiment of a swapper unit for use in the swapper cell of FIG. 15A.
Figure 16A:
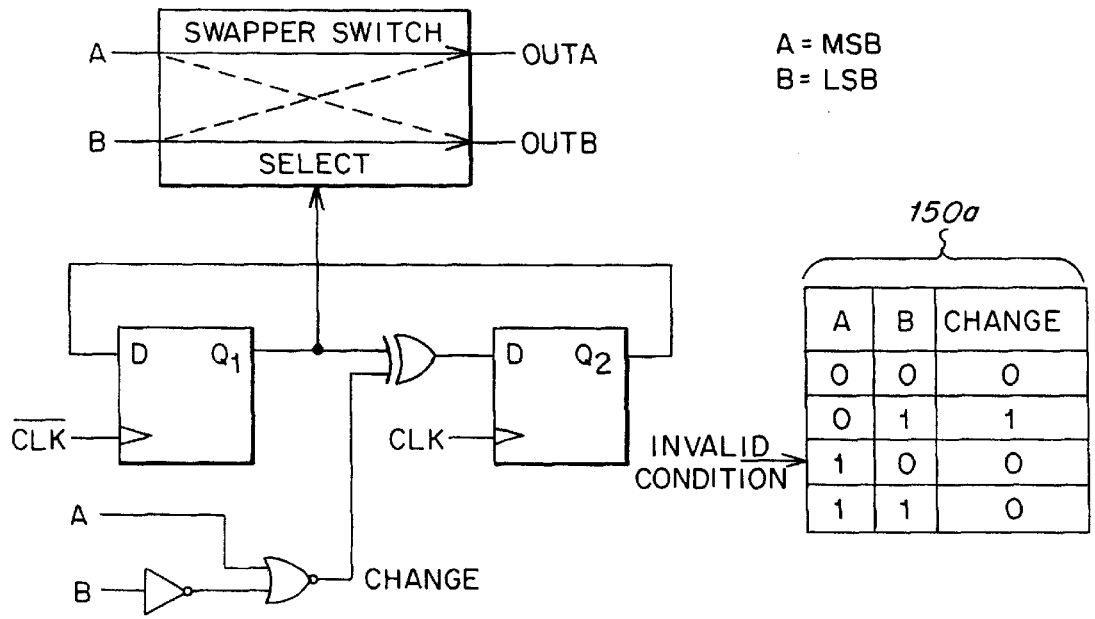
FIG. 16A illustrates one embodiment of a type 1 swapper cell for use in the data scrambler of FIG. 13.

The first three columns of swapper cells 133 are implemented using a swapper cell design intended to be capable of quick transition from logic high to logic low levels. Accordingly, the swapper unit of FIG. 15A, implemented using N-channel transistors, is used. For this swapper unit, the swapper cell illustrated in FIG. 16A is appropriate. The function of this cell was described above. The table at 150a illustrates the value of the signal change, whose operation is described above.

The column of inverters 134 is placed after the third column of swapper cells. This column of inverters 134 drives the parasitic capacitance of the last two columns of swapper cells 135.

Because the inverters 134 invert the signal received from the first three stages of swapper cells 133, the swapper cells in the following stages 135 should be implemented to allow a quick transition from a low logic level to a high logic level (i.e., the converse of the preferred rise time in the first three stages of swapper cells 133).

Figure 15B:
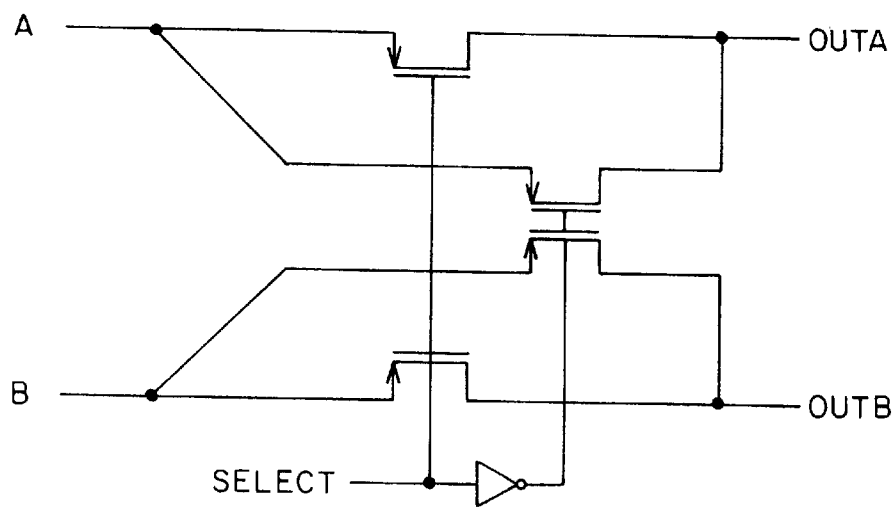
FIG. 15B illustrates one embodiment of a swapper unit for use in the swapper cell of FIG. 15B.
Figure 16B:
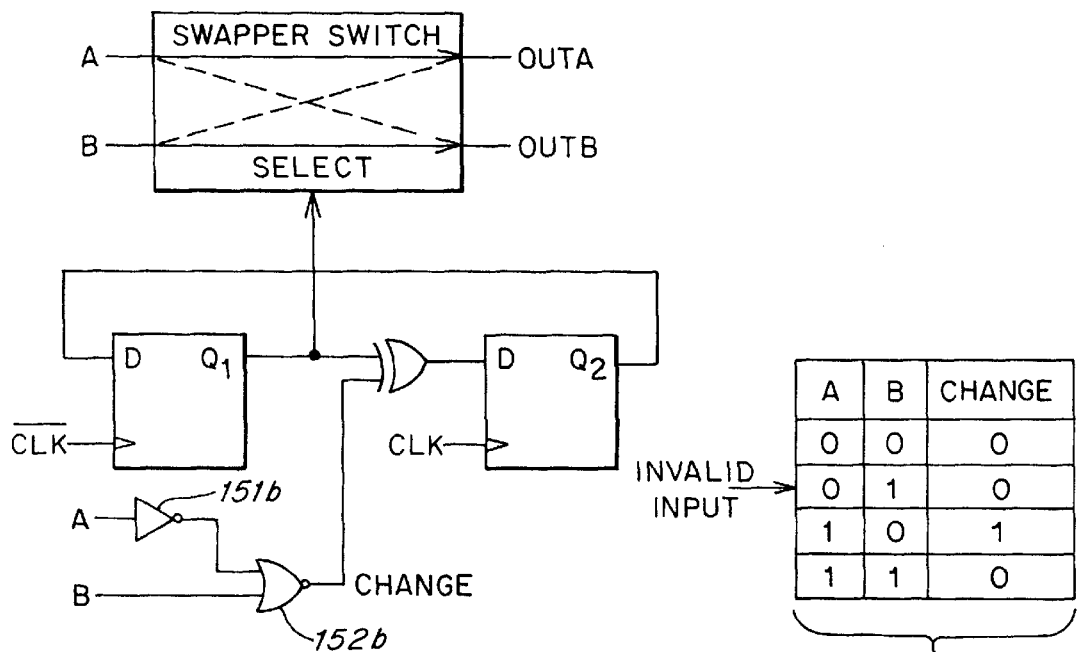
FIG. 16B illustrates one embodiment of a type 2 swapper cell for use in the data scrambler of FIG. 13.

To implement the second type of swapper cells, 135, a swapper unit using P-channel transistors may be preferred, as illustrated in FIG. 15B. Because the signal is inverted, the swapper cell unit of FIG. 16B is implemented for the type 2 swapper cells 135. As can be seen, the logic for the signal change is inverted. Accordingly, an inverter 151b is coupled to the input A, for input to the NOR gate 152b, rather than having the inverter coupled between the B input and the NOR gate, as in FIG. 16A.

Returning to FIG. 14, a column of inverting buffers 136 is provided to drive the outputs of the data scrambler. These also serve to return the output from an inverted thermometer code to a regular thermometer code output.

As could be appreciated by one of skill in the art, based on the disclosure provided herein, the structures disclosed herein may be modified, as in the Adams and Kwan patent, to include more than two states for the history of the cell. For example, the cells could be implemented using a state indicating that the next input should be swapped, a state indicating that the next input should be passed through, and a state indicating that random selection of swap and pass through should be performed (where the same number of 1's have already been sent on each of the cell's two outputs). Thus, if more 1's have been sent on output A, the next 1 will be sent on output B. If more 1's have been sent on output B, the next 1 will be sent on output A. If the number is equal, then one of output A and output B can be randomly selected to receive the next 1.

Having thus described at least one illustrative embodiment of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

We claim:

1. A digital to analog converter system, comprising
   a data scrambler having an input and an output, the data scrambler comprising
      a first swapper cell stage having a plurality of primary inputs, each of the primary inputs corresponding to a numbered bit position from a lower number bit position to a higher number bit position, the first swapper cell stage comprising a first plurality of swapper cells, each having a first input, a second input, a first output and a second output,
      a second swapper cell stage comprising a second plurality of swapper cells, each having a first input and a second input, the inputs of the second plurality of swapper cells being coupled to the outputs of the first plurality of swapper cells,
      one or more subsequent swapper cell stages, comprising a third plurality of swapper cells, each having a first input and a second input, and
      a set of connections among the second plurality of swapper cells and the third plurality of swapper cells, the connections being arranged so that each of a plurality of the third plurality of swapper cells can only receive on its first input a signal passed from a primary input corresponding to a lower number bit position than any number bit position corresponding to a signal that can be passed to its second input; and
   a circuit to convert the output of the data scrambler to an analog signal.

2. The digital to analog converter of claim 1, wherein each of a plurality of swapper cells selected from the first plurality, second plurality and third plurality of swapper cells comprises:
   a swapper unit having a first data input, a second data input, a first data output, a second data output and a swap input;
   a storage element to store a swap value, the storage element having an input and an output, the output being coupled to the swap input of the swapper unit; and
   a logic circuit to produce a signal defining whether a subsequent input received on the first data input and the second data input of the swapper unit will be swapped, said signal being produced independent of a value of the subsequent input, the logic circuit having an output coupled to the input of the storage element.

3. The digital to analog converter of claim 1, wherein each of substantially all of the first plurality, second plurality and third plurality of swapper cells comprises:
   a swapper unit having a first data input, a second data input, a first data output, a second data output and a swap input;
   a storage element to store a swap value, the storage element having an input and an output, the output being coupled to the swap input of the swapper unit; and
   a logic circuit to produce a signal defining whether a subsequent input received on the first data input and the second data input of the swapper unit will be swapped, said signal being produced independent of a value of the subsequent input, the logic circuit having an output coupled to the input of the storage element.

4. The digital to analog converter of claim 1, wherein each of a plurality of swapper cells selected from the first plurality, second plurality and third plurality of swapper cells comprises:
- a swapper unit having a first data input, a second data input, a first data output, a second data output and a swap input;
- a first storage element to store a current swap value, the storage element having an input and an output, the output being coupled to the swap input of the swapper unit;
- a second storage element to store a next swap value, having an input and having an output coupled to the input of the first storage element; and
- a logic circuit, having a first input coupled to the output of the first storage element, a second input coupled to the first input of the swapper unit, a third input coupled to the second input of the swapper unit and an output coupled to the input of the second storage element, to produce a next swap signal.

5. The digital to analog converter of claim 1, wherein each of substantially all of the first plurality, second plurality and third plurality of swapper cells comprises:
- a swapper unit having a first data input, a second data input, a first data output, a second data output and a swap input;
- a first storage element to store a current swap value, the storage element having an input and an output, the output being coupled to the swap input of the swapper unit;
- a second storage element to store a next swap value, having an input and having an output coupled to the input of the first storage element; and
- a logic circuit, having a first input coupled to the output of the first storage element, a second input coupled to the first data input of the swapper unit, a third input coupled to the second data input of the swapper unit and an output coupled to the input of the second storage element, to produce a next swap signal.

6. A digital to analog converter system, comprising
a data scrambler having an input to receive a thermometer code input and an output, the data scrambler comprising
- a first swapper cell stage, comprising a first plurality of swapper cells, each having a first input and a second input,
- one or more subsequent swapper cell stages, comprising a second plurality of swapper cells, each having a first input and a second input, and
- wherein a plurality of the first plurality and second plurality of swapper cells comprises
  - a swapper unit having a first data input, a second data input, a first data output, a second data output and a swap input,
  - a storage element to store a swap value, the storage element having an input and an output, the output being coupled to the swap input of the swapper unit, and
  - a logic circuit to produce a signal defining whether a subsequent input received on the first data input and the second data input of the swapper unit will be swapped, said signal being produced independent of a value of the subsequent input history, the logic circuit having an output coupled to the input of the storage element; and
a circuit to convert the output of the data scrambler to an analog signal.

7. A method of using a swapper cell in a data scrambler apparatus, the swapper cell having a first input, a second input, a first output and a second output, the method comprising steps of:
- determining whether to swap next input data bits, independent of a value of the next input data bits;
- receiving the next input data bits on the first input and the second input; and
- propagating the next input data bits to the first output and the second output, selectively swapping the next input data bits in response to an outcome of the determining step.

8. The method of claim 7, wherein the determining step comprises a step of determining whether to swap next input data bits, independent of a value of the next input data bits and based on a history of values propagated through the cell.

9. The method of claim 7, wherein the receiving step is performed after the determining step.

10. The method of claim 7, wherein the propagating step is commenced immediately on receiving the next data inputs.

11. The method of claim 7, further comprising steps of:
- receiving prior input bits, before receiving the next input bits; and
- propagating the prior input data bits to the first output and the second output; and
- wherein the determining step is performed during the step of propagating the prior input data bits.

12. The method of claim 7, wherein the swapper cell is for use in a data scrambler in a digital to analog converter system.

13. A swapper cell comprising:
- a swapper unit having a first data input, a second data input, a first data output, a second data output and a swap input;
- a storage element to store a swap value, the storage element having an input and an output, the output being coupled to the swap input of the swapper unit; and
- a logic circuit to produce a signal defining whether a subsequent input received on the first data input and the second data input of the swapper unit will be swapped, said signal being produced independent of a value of the subsequent input, the logic circuit having an output coupled to the input of the storage element.

14. The swapper cell of claim 13, wherein the logic circuit is to produce the signal defining whether the subsequent input will be swapped, independent of a value of the subsequent input and based on a history of values propagated through the cell.

15. The swapper cell of claim 13, wherein the logic circuit implements the following truth table functions:

| first data input | second data input | swap value | logic circuit output |
|---|---|---|---|
| 0 | 0 | X | SAME AS SWAP VALUE |
| 0 | 1 | 0 | 1 |
| 0 | 1 | 1 | 0 |
| 1 | 0 | X | X |
| 1 | 1 | X | SAME AS SWAP VALUE. |

16. The swapper cell of claim 13, for use in a data scrambler in a digital to analog converter system.

17. A swapper cell comprising:
- a swapper unit having a first data input, a second data input, a first data output, a second data output and a swap input;

a first storage element to store a current swap value, the storage element having an input and an output, the output being coupled to the swap input of the swapper unit; and a second storage element to store a next swap value, having an input and having an output coupled to the input of the first storage element.

18. The swapper cell of claim 17, further comprising a logic circuit, having a first input coupled to the output of the first storage element, a second input coupled to the first data input of the swapper unit, a third input coupled to the second data input of the swapper unit and an output coupled to the input of the second storage element, to produce a next swap signal.

19. The swapper cell of claim 18, wherein:

the first storage element has a clock input to receive a first clock signal; and the second storage element has a clock input to receive a second clock signal, the second clock signal being out of phase with the first clock signal.

20. The swapper cell of claim 19, wherein the second clock signal is about 180 degrees out of phase with the first clock signal.

21. The swapper cell of claim 19, wherein data is clocked through the swapper cell synchronously with the first clock signal.

22. A data scrambler comprising:

a first swapper cell stage having a plurality of primary inputs, each of the primary inputs corresponding to a numbered bit position from a lower number bit position to a higher number bit position, the first swapper cell stage comprising a first plurality of swapper cells, each having a first input, a second input, a first output and a second output;

a second swapper cell stage comprising a second plurality of swapper cells, each having a first input and a second input, the inputs of the second plurality of swapper cells being coupled to the outputs of the first plurality of swapper cells; and a set of connections among the second plurality of swapper cells and the third plurality of swapper cells, the connections being arranged so that each of a plurality of the second plurality of swapper cells can only receive on its first input a signal passed from a primary input corresponding to a lower number bit position than any number bit position corresponding to a signal that can be passed to its second input.

23. The data scrambler of claim 22, wherein the set of connections is arranged so that, in at least one of the one or more subsequent swapper cell stages, each of all of the third plurality of swapper cells in that stage can only receive on its first input a signal passed from a primary input corresponding to a lower number bit position than any number bit position corresponding to a signal that can be passed to its second input.

24. The data scrambler of claim 22, wherein the set of connections is arranged so that, in at least one of the one or more subsequent swapper cell stages, each of the second plurality of swapper cells in that stage can only receive on its first input a signal passed from a primary input corresponding to a lower number bit position than any number bit position corresponding to a signal that can be passed to its second input.

25. The data scrambler of claim 22, wherein the set of connections is arranged so that each of substantially all of the second plurality of swapper cells can only receive on its first input a signal passed from a primary input corresponding to a lower number bit position than any number bit position corresponding to a signal that can be passed to its second input.

26. A data scrambler comprising:

a first swapper cell stage having a plurality of primary inputs, each of the primary inputs corresponding to a numbered bit position from a lower number bit position to a higher number bit position, the first swapper cell stage comprising a first plurality of swapper cells, each having a first input, a second input, a first output and a second output;

a second swapper cell stage comprising a second plurality of swapper cells, each having a first input and a second input, the inputs of the second plurality of swapper cells being coupled to the outputs of the first plurality of swapper cells;

one or more subsequent swapper cell stages, comprising a third plurality of swapper cells, each having a first input and a second input; and a set of connections among the second plurality of swapper cells and the third plurality of swapper cells, the connections being arranged so that when any thermometer code input is presented on the primary inputs, at least one of the third plurality of swapper cells can receive as a digital input on its first input and second input fewer than all possible digital input values for a swapper cell.

27. A data scrambler comprising:

a first integral array of swapper cells, the array having a plurality of primary inputs and a plurality of outputs;

a second integral array of swapper cells, the array having a plurality of primary inputs and a plurality of outputs; and a column of swapper cells, each having a first input and a second input, the first input being coupled to an output of the first array and the second input being coupled to an output of the second array.

28. A method of scrambling data comprising steps of:

providing a plurality of swapper cells, each having a first input and a second input, the swapper cells being interconnected to form a network having a first stage of cells and one or more subsequent stages of cells;

for each of a plurality of the swapper cells in the one or more subsequent stages of cells, restricting the range of possible data that can be received on the swapper cell's inputs; and using the plurality of swapper cells to scramble data received on the input to the network.

29. A data scrambler for a digital to analog converter, comprising:

a plurality of a first type of swapper cell;

a plurality of a second type of swapper cell; and a set of interconnections among the first type of swapper cells and the second type of swapper cells.

30. The data scrambler of claim 29, wherein:

the first type of swapper cell has skewed transition times, favoring a fast low to high transition time; and the second type of swapper cell has skewed transition times, favoring a fast high to low transition time.

31. The data scrambler of claim 29, wherein:

the first type of swapper cell compises a swapper unit implemented using N-channel transistors; and the second type of swapper cell comprises a swapper unit implemented using P-channel transistors.

\* \* \* \* \*